(12) United States Patent
Chun et al.

(10) Patent No.: US 12,284,821 B2
(45) Date of Patent: Apr. 22, 2025

(54) SEMICONDUCTOR DEVICES

(71) Applicant: Samsung Electronics Co., Ltd., Suwon-si (KR)

(72) Inventors: Junghwan Chun, Anyang-si (KR); Hongsik Shin, Seoul (KR); Koungmin Ryu, Hwaseong-si (KR); Bongkwan Baek, Seoul (KR); Jongmin Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 474 days.

(21) Appl. No.: 17/849,797

(22) Filed: Jun. 27, 2022

(65) Prior Publication Data
US 2023/0072817 A1 Mar. 9, 2023

(30) Foreign Application Priority Data
Sep. 6, 2021 (KR) .................. 10-2021-0118399

(51) Int. Cl.
| | | |
|---|---|---|
| H10D 30/67 | (2025.01) | |
| H01L 21/02 | (2006.01) | |
| H10D 30/01 | (2025.01) | |
| H10D 30/43 | (2025.01) | |
| H10D 62/10 | (2025.01) | |
| H10D 64/01 | (2025.01) | |

(52) U.S. Cl.
CPC ... H10D 30/6729 (2025.01); H01L 21/02603 (2013.01); H10D 30/014 (2025.01); H10D 30/031 (2025.01); H10D 30/43 (2025.01); H10D 30/6735 (2025.01); H10D 30/6757 (2025.01); H10D 62/121 (2025.01); H10D 64/01 (2025.01); H10D 64/017 (2025.01)

(58) Field of Classification Search
CPC ......... H01L 29/41733; H01L 21/02603; H01L 29/0673; H01L 29/401; H01L 29/42392; H01L 29/66439; H01L 29/66545; H01L 29/66742; H01L 29/775; H01L 29/78696; H01L 29/41766; H01L 21/823475; H01L 21/76832; H01L 21/76834; H01L 21/76897; H01L 21/823425; H01L 21/823437; H01L 21/823468; B82Y 10/00
See application file for complete search history.

(56) References Cited

U.S. PATENT DOCUMENTS

| | | |
|---|---|---|
| 7,615,475 B2 | 11/2009 | Mieno |
| 8,957,465 B2 | 2/2015 | Xie et al. |

(Continued)

*Primary Examiner* — Allison Bernstein
(74) *Attorney, Agent, or Firm* — Myers Bigel, P.A.

(57) ABSTRACT

A semiconductor device includes an active region extending on a substrate in a first direction, a gate structure including a gate electrode extending on the substrate in a second direction and traversing the active region, a spacer structure extending on opposing sidewalls of the gate electrode in the second direction, and a capping layer on the gate electrode and the spacer structure, a source/drain region on the active region adjacent the gate structure, and a first contact plug connected to the source/drain region and a second contact plug connected to the gate structure. The capping layer includes a lower capping layer and an upper capping layer on the lower capping layer, and the second contact plug penetrates through the capping layer, is connected to the gate electrode and includes a convex sidewall penetrating into the upper capping layer.

20 Claims, 37 Drawing Sheets

(56) References Cited

U.S. PATENT DOCUMENTS

| | | | |
|---|---|---|---|
| 9,105,578 | B2 | 8/2015 | Liang et al. |
| 9,548,366 | B1 | 1/2017 | Ho et al. |
| 10,163,704 | B2 | 12/2018 | Chen et al. |
| 10,522,537 | B2 | 12/2019 | Kim et al. |
| 10,553,582 | B2* | 2/2020 | Kim ............... H01L 29/4238 |
| 10,879,244 | B2* | 12/2020 | Shin ............... H01L 29/66795 |
| 10,998,229 | B2 | 5/2021 | Cheng et al. |
| 2013/0320411 | A1 | 12/2013 | Fan et al. |
| 2015/0137273 | A1 | 5/2015 | Zhang et al. |
| 2021/0104612 | A1* | 4/2021 | Bae ............... H01L 21/823821 |
| 2022/0310811 | A1* | 9/2022 | Min ............... H01L 29/0847 |

* cited by examiner

SEMICONDUCTOR DEVICES

CROSS-REFERENCE TO RELATED APPLICATION(S)

This application claims priority under 35 USC 119(a) to Korean Patent Application No. 10-2021-0118399 filed on Sep. 6, 2021 in the Korean Intellectual Property Office, the entire disclosure of which is incorporated herein by reference for all purposes.

BACKGROUND

The present inventive concept relates to a semiconductor device.

As demand for high performance, high speed, and/or multifunctionality of semiconductor devices increases, the degree of integration of semiconductor devices increases. Manufacturing a semiconductor device having a fine pattern for high integration may involve implementing patterns having a fine width and/or a narrow separation distance. In addition, in order to reduce the limitations of operating characteristics due to the size reduction of planar metal oxide semiconductor FETs, efforts are being made to develop semiconductor devices including FinFETs having a three-dimensional channel structure.

SUMMARY

Example embodiments provide a semiconductor device having an improved production yield.

According to example embodiments, a semiconductor device includes an active region extending on a substrate in a first direction and including an impurity region, a gate structure including a gate electrode extending on the substrate in a second direction while traversing (e.g., intersecting) the active region, a spacer structure extending on both sidewalls (e.g., opposing sidewalls) of the gate electrode in the second direction, and a capping layer on the gate electrode and the spacer structure, a source/drain region on the active region adjacent the gate structure, and contact plugs including a first contact plug connected to the source/drain region and a second contact plug connected to the gate structure. The capping layer includes a lower capping layer and an upper capping layer on the lower capping layer, and the second contact plug penetrates through the capping layer, is connected to the gate electrode and includes a convex sidewall penetrating into the upper capping layer. In some embodiments, the convex sidewall may be curved toward the upper capping layer.

According to example embodiments, a semiconductor device includes an active region extending on a substrate in a first direction and including an impurity region, a plurality of channel layers spaced apart from each other vertically on the active region, a gate structure including a gate electrode extending in a second direction while traversing (e.g., intersecting) the active region and the plurality of channel layers and surrounding the plurality of channel layers, on the substrate, a spacer structure extending on both sidewalls (e.g., opposing sidewalls) of the gate electrode in the second direction, and a capping layer on the gate electrode and the spacer structure, a source/drain region on the active region adjacent the gate structure, and in contact with the plurality of channel layers, and a contact plug including a first contact plug connected to the source/drain region and a second contact plug connected to the gate structure. The capping layer includes a lower capping layer and an upper capping layer on the lower capping layer, and the second contact plug penetrates through the capping layer, is connected to the gate electrode and includes a convex sidewall penetrating into the upper capping layer. In some embodiments, the convex sidewall may be curved toward the upper capping layer.

According to example embodiments, a semiconductor device includes an active region extending on a substrate in a first direction and including an impurity region, first and second gate structures each including a gate electrode extending on the substrate in a second direction while traversing (e.g., intersecting) the active region, a spacer structure extending on both sidewalls (e.g., opposing sidewalls) of the gate electrode in the second direction, and a capping layer on the gate electrode and the spacer structure, a source/drain region on the active region adjacent the first gate structure, and a contact plug connected to the source/drain region. The capping layer includes a lower capping layer and an upper capping layer on the lower capping layer, the upper capping layer of the first gate structure and the upper capping layer of the second gate structure have different shapes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
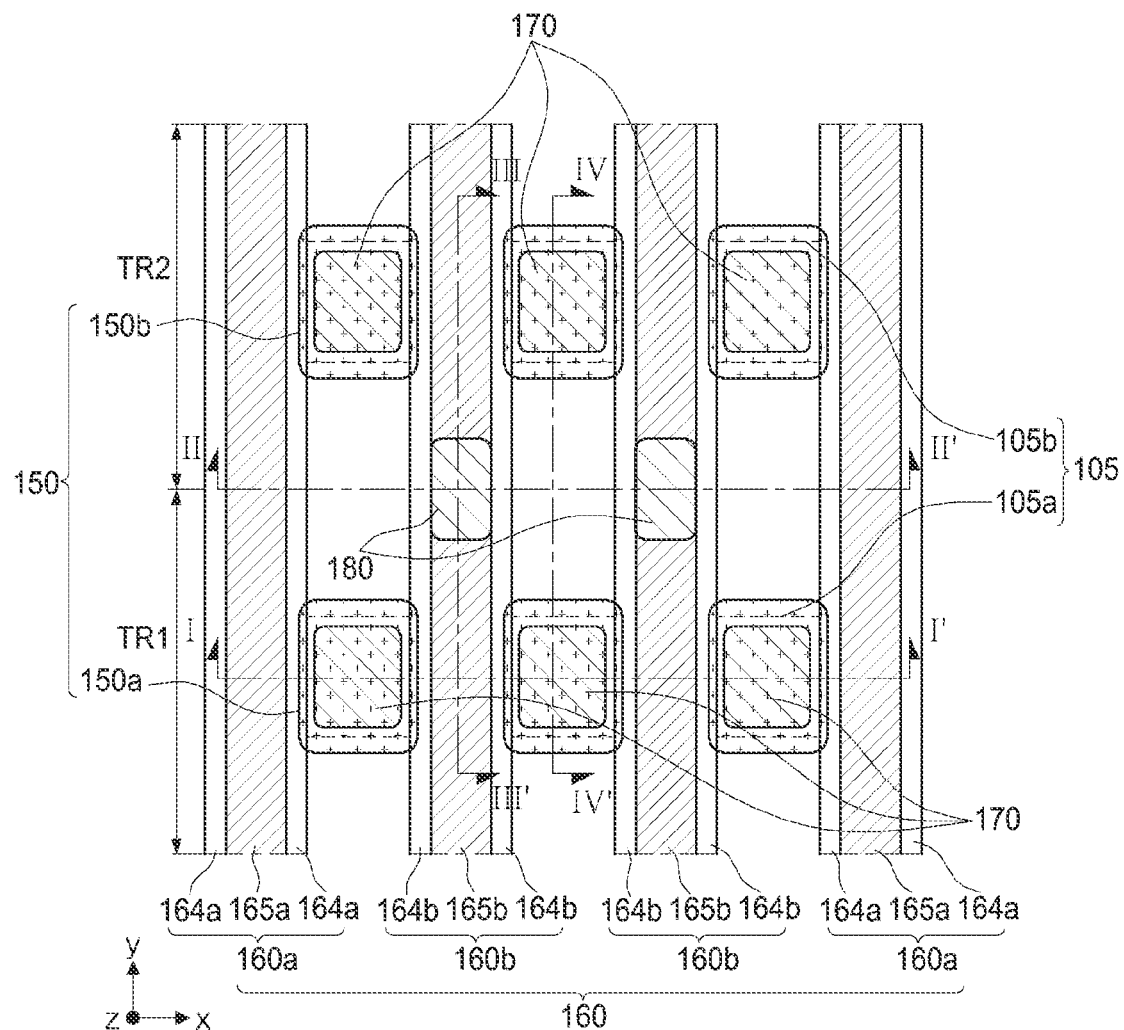
FIG. 1 is a plan view illustrating a semiconductor device according to example embodiments.
Figure 2A:
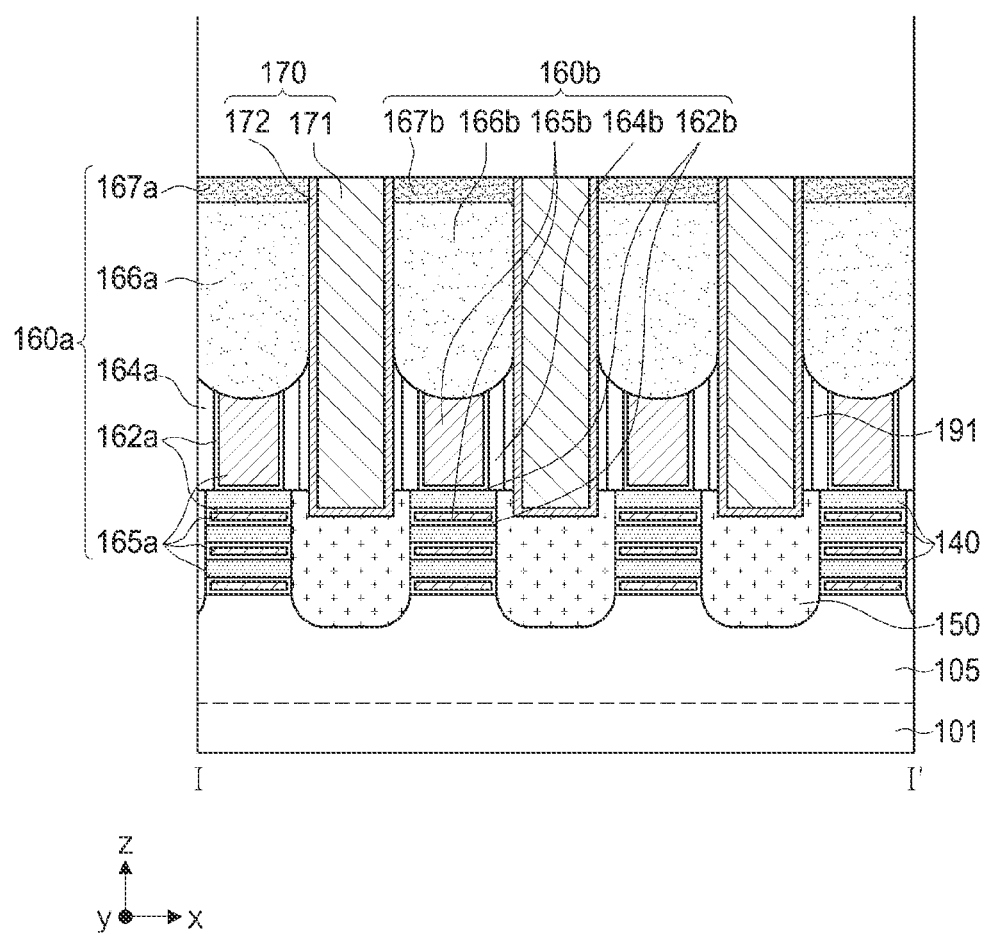
FIGS. 2A to 2D are cross-sectional views illustrating a semiconductor device according to example embodiments.
Figure 2B:
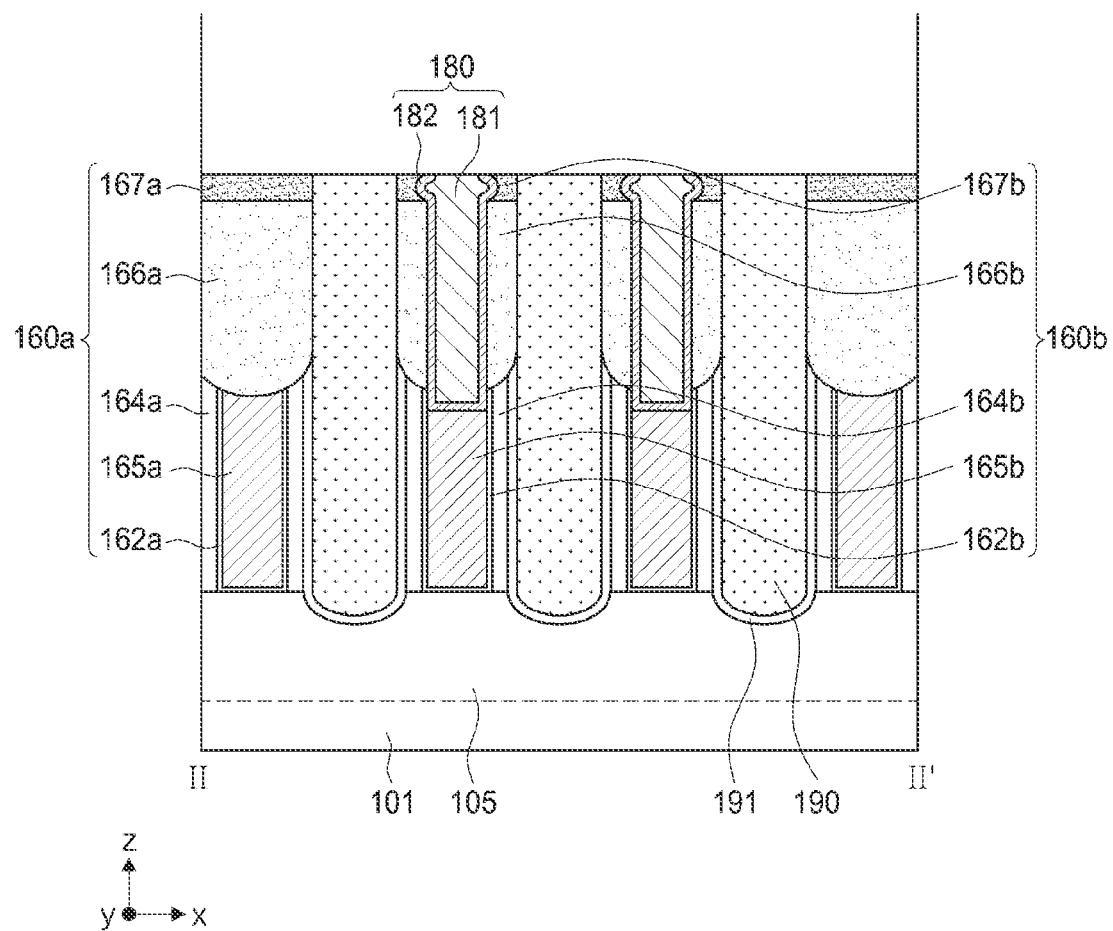
Figure 2C:
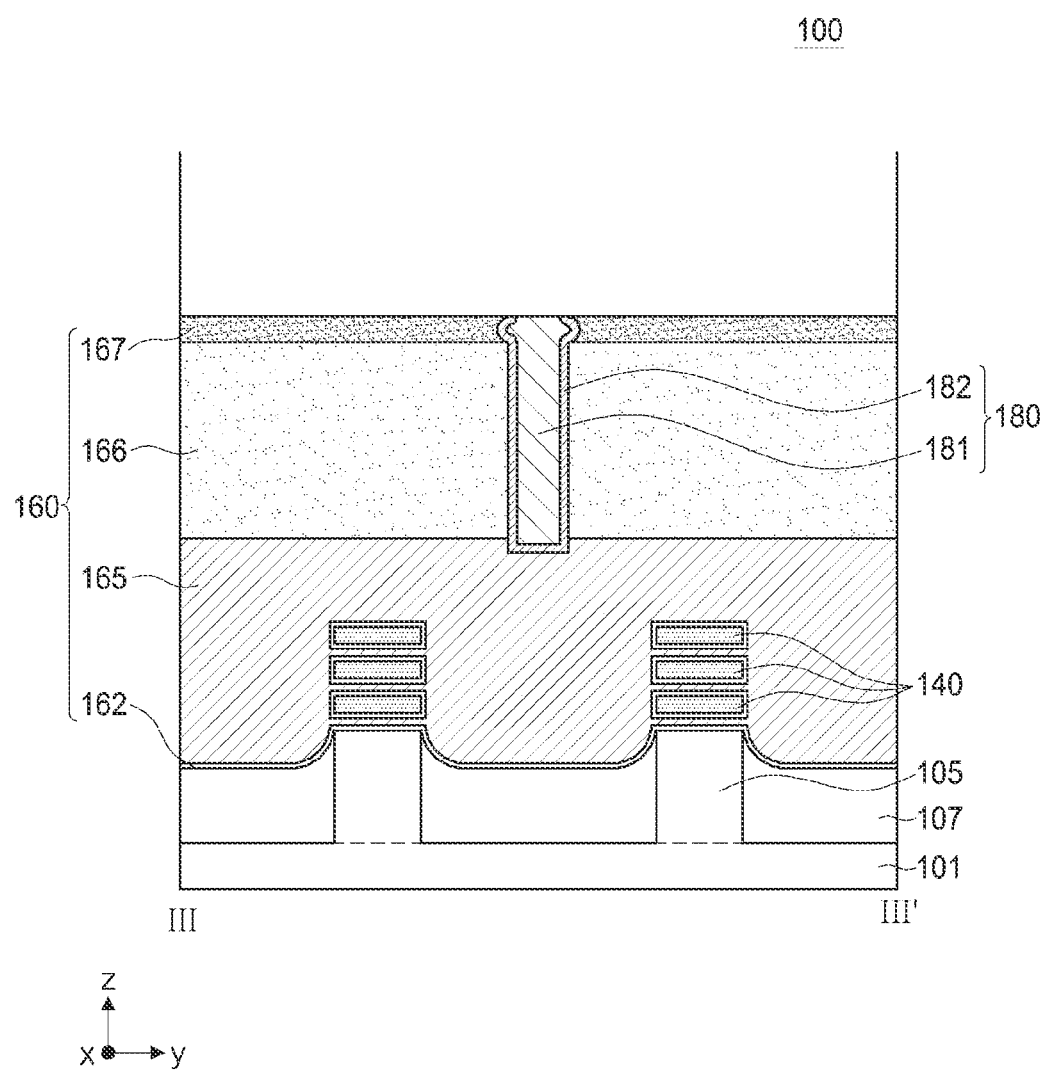
Figure 2D:
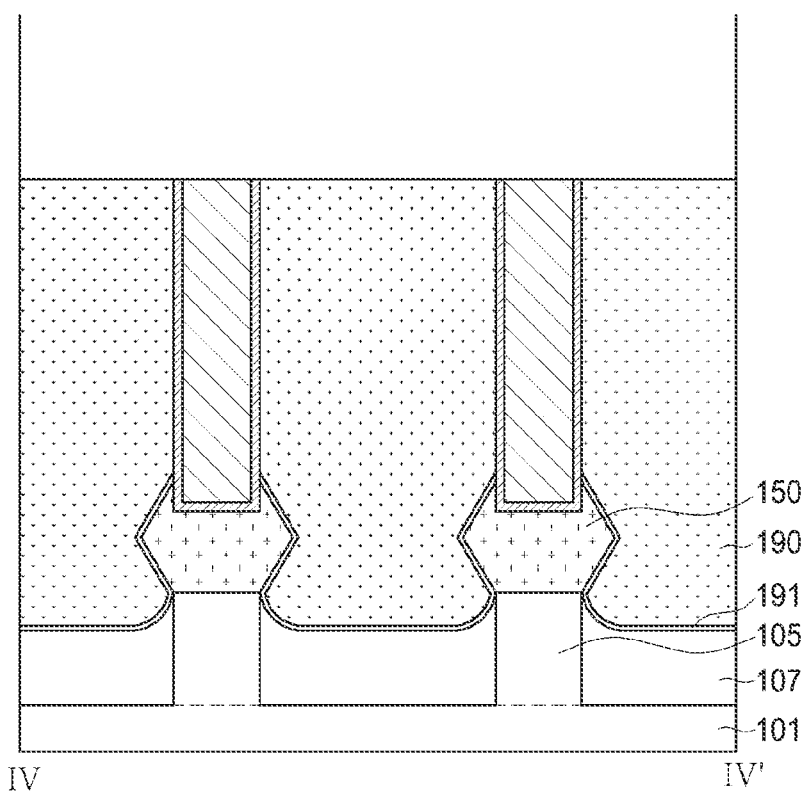

Hereinafter, example embodiments will be described with reference to the accompanying drawings, FIG. 1 is a plan view illustrating a semiconductor device 100 according to example embodiments. FIGS. 2A to 2D are cross-sectional views illustrating a semiconductor device 100 according to example embodiments. FIG. 2A is a cross-section of the semiconductor device 100 of FIG. 1 taken along line I-I', and FIG. 2B is a cross-section of the semiconductor device 100 of FIG. 1 taken along line II-II'. FIG. 2C is a cross-section of the semiconductor device 100 of FIG. 1 taken along line III-III', and FIG. 2D is a cross-section of the semiconductor device 100 of FIG. 1 taken along line IV-IV'. For convenience of description, only major components of the semiconductor device may be illustrated in FIGS. 1 to 2D.

Referring to FIGS. 1 to 2D, the semiconductor device 100 may include a substrate 101, active regions 105 on the substrate 101, device isolation layers 107 separating the active regions 105 from each other, channel layers 140 disposed on the active regions 105, source/drain regions 150 in contact with the channel layers 140, gate structures 160 extending to traverse (e.g., intersect) the active regions 105, contact plugs 170 and 180, and an interlayer insulating layer 190.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The active regions 105 may be disposed to extend in a direction parallel to the upper surface of the substrate 101, for example, in the X direction. The active regions 105 may be spaced apart from each other in the Y-direction and disposed in parallel. The active regions 105 may protrude from the upper surface of the substrate 101 in a vertical direction, the Z-direction. The upper ends of the active regions 105 may be disposed to protrude to a predetermined height from the upper surface of the device isolation layers 107. The active regions 105 may be formed as a portion of the substrate 101, or may include an epitaxial layer grown from the substrate 101. However, on both sides of the gate structures 160, the active regions 105 on the substrate 101 may be partially recessed, and the source/drain regions 150 may be disposed on the recessed active regions 105.

In an example embodiment, the active regions 105 may include a first active region 105a and a second active region 105b adjacent to each other. Each of the first active region 105a and the second active region 105b may have a line shape or a bar shape extending in the X-direction. The first active region 105a and the second active region 105b may be spaced apart from each other and extend in parallel, but the configuration is not limited thereto. The first active region 105a and the second active region 105b may have different conductivity types. When the first active region 105a has a first conductivity type, the second active region 105b may have a second conductivity type different from the first conductivity type. The first conductivity type may be an N-type conductivity type, and the second conductivity type may be a P-type conductivity type.

The device isolation layers 107 may define the active regions 105 in the substrate 101. The device isolation layers 107 may be disposed between the active regions 105. The device isolation layers 107 may have upper portions at a lower level than a level of the upper portions of the active regions 105. Accordingly, the device isolation layers 107 may partially expose the upper portions of the active regions 105. In an example embodiment, the device isolation layers 107 may have curved upper surfaces having a higher level as they are closer to the active regions 105, but the present inventive concept is not limited thereto. The device isolation layers 107 may be formed by, for example, a shallow trench isolation (STI) process. The device isolation layers 107 may be formed of an insulating material. The device isolation layers 107 may be, for example, oxide, nitride, or a combination thereof.

The channel layers 140 may be stacked on the active regions 105 while being spaced apart from each other in the Z-direction perpendicular to the substrate 101. The channel layers 140 may be spaced apart from the upper surfaces of the active regions 105 while being connected to the source/drain regions 150. The channel layers 140 may have the same or similar width as the active regions 105 in the Y-direction, and may have the same or similar width as the gate structures 160 in the X-direction. Although three channel layers 140 are illustrated, the number of channel layers is not limited thereto and may be variously changed. For example, in some embodiments, the channel layers 140 may further include a channel layer disposed on the upper surface of the active regions 105. The channel layers 140 may be formed of a semiconductor material, and may include, for example, at least one of silicon (Si), silicon germanium (SiGe), and germanium (Ge). Each of the channel layers 140 may include the same material, but may include different materials according to example embodiments. As used herein "a direction perpendicular to a substrate" may refer to a direction perpendicular to an upper surface of the substrate.

In an example embodiment, the channel layers 140 may include first channel layers disposed on the first active region 105a and second channel layers disposed on the second active region 105b.

The source/drain regions 150 may be disposed on the active regions 105, on at least one side of the channel layers 140. The source/drain regions 150 may be disposed to cover upper surfaces of the active regions 105, on the respective side surfaces of the channel layers 140 and on the lower ends of the source/drain regions 150. The source/drain regions 150 may contact the channel layers 140. The source/drain regions 150 may be disposed by partially recessing the upper portions of the active regions 105, but in example embodiments, the presence or absence of the recess and the depth of the recess may be variously changed. The source/drain regions 150 may be a semiconductor layer including silicon (Si), and may be formed of an epitaxial layer. As used herein, "side surface" and "side" may be interchangeable with "sidewall".

In an example embodiment, the source/drain regions 150 may include a first source/drain region 150a disposed on the first active region 105a, and a second source/drain region 150b disposed on the second active region 105b. The first and second source/drain regions 150a and 150b may include impurities of different types and/or concentrations. For example, the first source/drain region 150a may have the second conductivity type, and the second source/drain region 150b may have the first conductivity type. For example, the first source/drain region 150a and the first active region 105a may have different conductivity types.

In some embodiments, the first source/drain region 150a may have a connected and merged shape, between the active regions 105 adjacent in the Y-direction, but the configuration is not limited thereto.

The gate structures 160 may be disposed to intersect the active regions 105 and the channel layers 140, on the upper portions of the active regions 105 and the channel layers 140, and to extend in one direction, for example, the Y-direction. Channel regions of transistors may be formed in the active regions 105 and/or the channel layers 140 intersecting the gate structures 160.

Each of the gate structures 160 may include a gate dielectric layer 162 (e.g., 1.62a and 162b), a gate electrode 165 (e.g., 165a and 165b), a spacer structure 164 (e.g., 164a and 164b), and capping layers 166 (e.g., 166a and 166b) and 167 (e.g., 167a and 167b). Between the channel layers 140, upper and lower surfaces of each of the gate structures 160 may contact the channel layers 140.

The gate dielectric layer 162 may be disposed between each of the active regions 105 and the gate electrode 165 and between the channel layers 140 and the gate electrode 165, and may be disposed to cover at least a portion of the surfaces of the gate electrode 165. For example, the gate dielectric layer 162 may be disposed to surround all surfaces except the uppermost surface of the gate electrode 165. The gate dielectric layer 162 may extend between the gate electrode 165 and the spacer structure 164, but the configuration is not limited thereto. The gate dielectric layer 162 may include an oxide, nitride, or a high-k material. The high-k material may refer to a dielectric material having a higher dielectric constant than that of a silicon oxide ($SiO_2$). The high-k material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In some embodiments, the gate dielectric layer 162 may be formed of multiple layers.

The gate electrode 165 may be disposed on the active regions 105 to fill between the channel layers 140 and to extend upwardly of the channel layers 140. The gate electrode 165 may be spaced apart from the channel layers 140 by the gate dielectric layer 162. The gate electrode 165 may include a conductive material, for example, a metal nitride such as titanium nitride (TiN), tantalum nitride (TaN), or tungsten nitride (WN), and/or a metallic material such as aluminum (Al), tungsten (W), or molybdenum (Mo), or a semiconductor material such as doped polysilicon. In some embodiments, the gate electrode 165 may also be formed of two or more multiple layers. Depending on the configuration of the semiconductor device 100, the gate electrodes 165 may be disposed to be separated between at least some of the adjacent transistors by a separate separator. The gate electrodes 165 may include different materials according to transistor regions.

The spacer structure 164 may be disposed on both sidewalls of the gate electrode 165 and may extend in the Z direction perpendicular to the upper surface of the substrate 101. The upper portion of each of the spacer structures 164 may include a portion that has a width narrower than the width of the lower portion thereof. The spacer structure 164 may include a convex upper surface toward the substrate 101. However, the shape of the spacer structure 164 may be variously changed according to an example embodiment. The spacer structure 164 may insulate the source/drain regions 150 from the gate electrode 165. The spacer structure 164 may be formed of multiple layers according to example embodiments. The spacer structure 164 may be formed of oxide, nitride, and oxynitride. As used herein, "a convex surface toward an element A" (or similar language) may refer to a surface curved toward the element A.

The capping layers 166 and 167 may be disposed on the gate electrode 165. The capping layers 166 and 167 may be a structure protecting the gate electrode 165 from etching in a subsequent process after forming the gate electrode 165. The capping layers 166 and 167 may be a structure that supports the contact plug 180 to be self-aligned during the contact plug forming process. However, the roles of the capping layers 166 and 167 are not limited thereto.

The capping layers 166 and 167 may include a lower capping layer 166 disposed on the gate electrode 165 and an upper capping layer 167 disposed on the lower capping layer 166.

The lower capping layer 166 may be disposed on the gate electrode 165 and the spacer structure 164, and at least a portion of a lower surface thereof may be surrounded by the gate electrode 165 and the spacer structure 164. In an example embodiment, the lower capping layer 166 may include a lower surface having a convex shape toward the substrate 101. The lower surface of the lower capping layer 166 may cover the gate electrode 165 and the spacer structure 164. The upper surface of the gate electrode 165 and the upper surface of the spacer structure 164 may be coplanar. The width of the lower capping layer 166 in the X direction may be equal to or similar to the sum of the widths of the gate electrode 165 and the spacer structures 164 disposed on both sidewalls of the gate electrode in the X direction, but is not limited thereto. The lower capping layer 166 may include silicon nitride or a silicon nitride-based insulating material. In some embodiments, a portion of the upper surface of the gate electrode 165 and a portion of the upper surface of the spacer structure 164 may be coplanar and may form a continuous even surface as illustrated in FIGS. 2A and 2B.

The upper capping layer 167 may be disposed on the lower capping layer 166. A side surface of the upper capping layer 167 may contact the first contact plug 170 and the interlayer insulating layer 190. The upper capping layer 167 may include an insulating material having the same or similar dielectric constant as the lower capping layer 166 and having a higher etch resistance than that of the lower capping layer 166. For example, the upper capping layer 167 may include a material different from that of the lower capping layer 166. The upper capping layer 167 may include, for example, aluminum oxide ($Al_xO_y$). A first thickness of the upper capping layer 167 in the Z direction may be less than a second thickness of the lower capping layer 166 in the Z direction. However, the thicknesses of the capping layers 166 and 167 are not limited thereto, and in some embodiments, the first thickness may be greater than the second thickness. For example, as the thickness of the upper capping layer 167 is adjusted according to the number of etching process steps after the upper capping layer 167 is formed, the first thickness and the second thickness may be changed. A first width of the upper capping layer 167 in the X-direction may be substantially the same as a second width of the lower capping layer 166 in the X-direction. Accordingly, the side surface of the upper capping layer 167 may be coplanar with the side surface of the lower capping layer 166. As used herein, "a width of an element A" may refer to a widest width of the element A when the element A has a non-uniform width.

Figure 16:
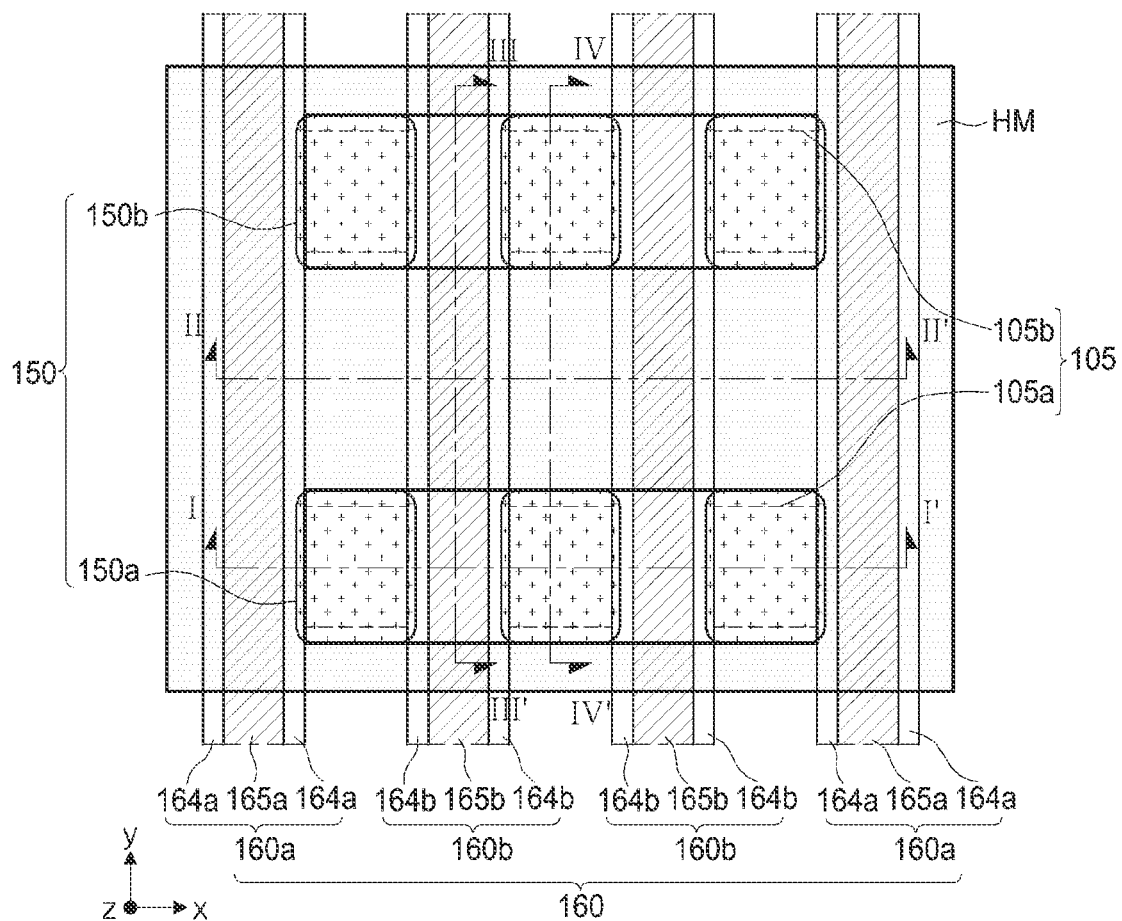
Figure 17A:
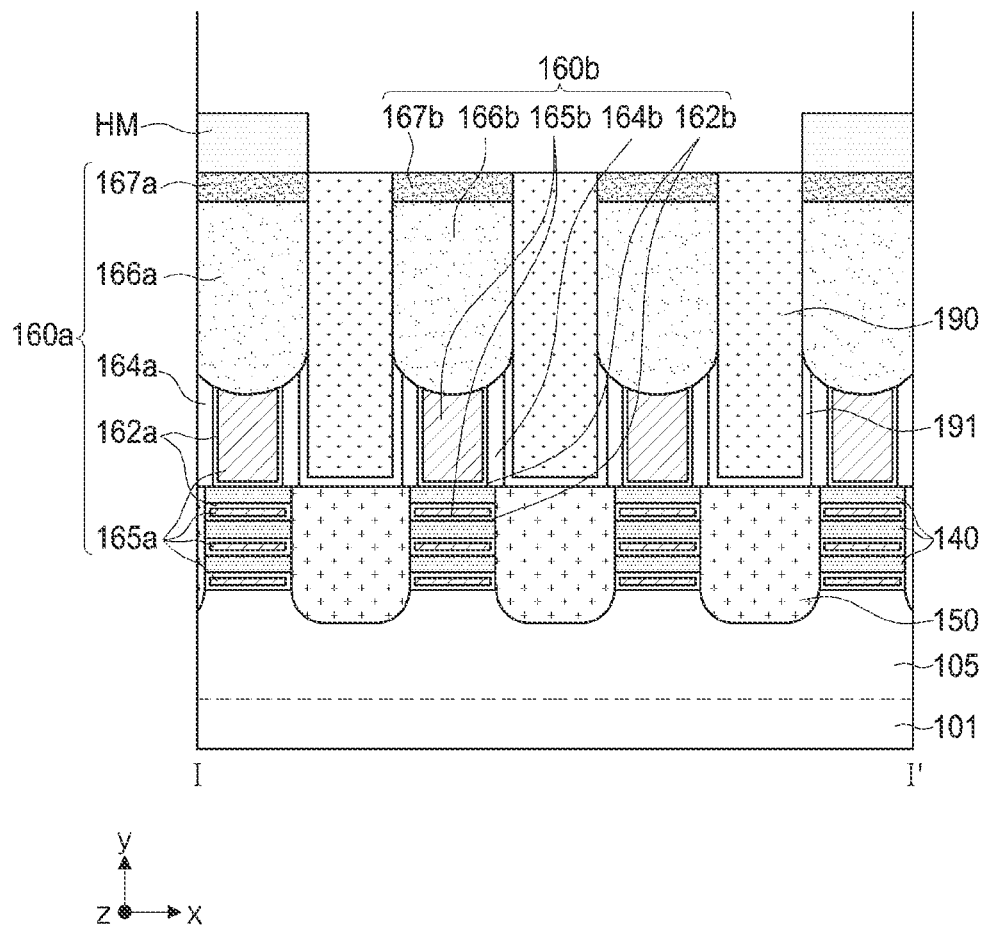
Figure 17B:
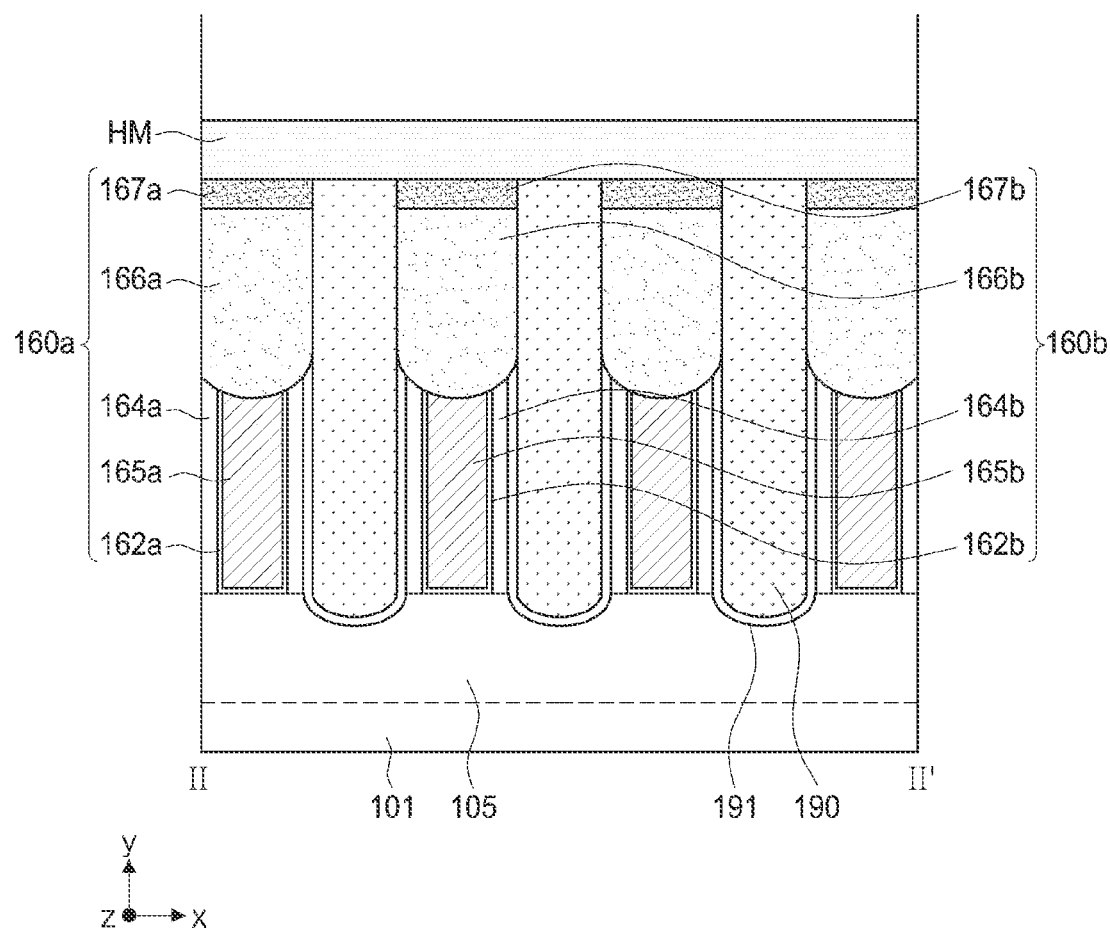
Figure 17C:
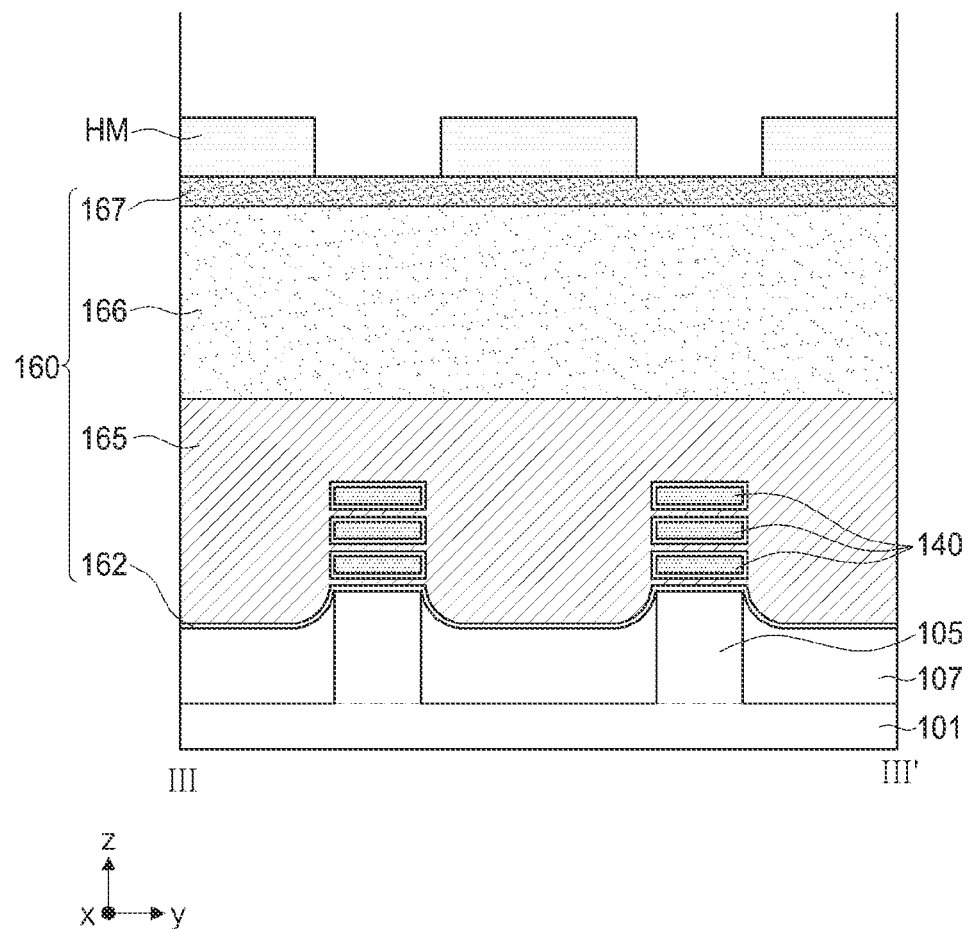
Figure 17D:
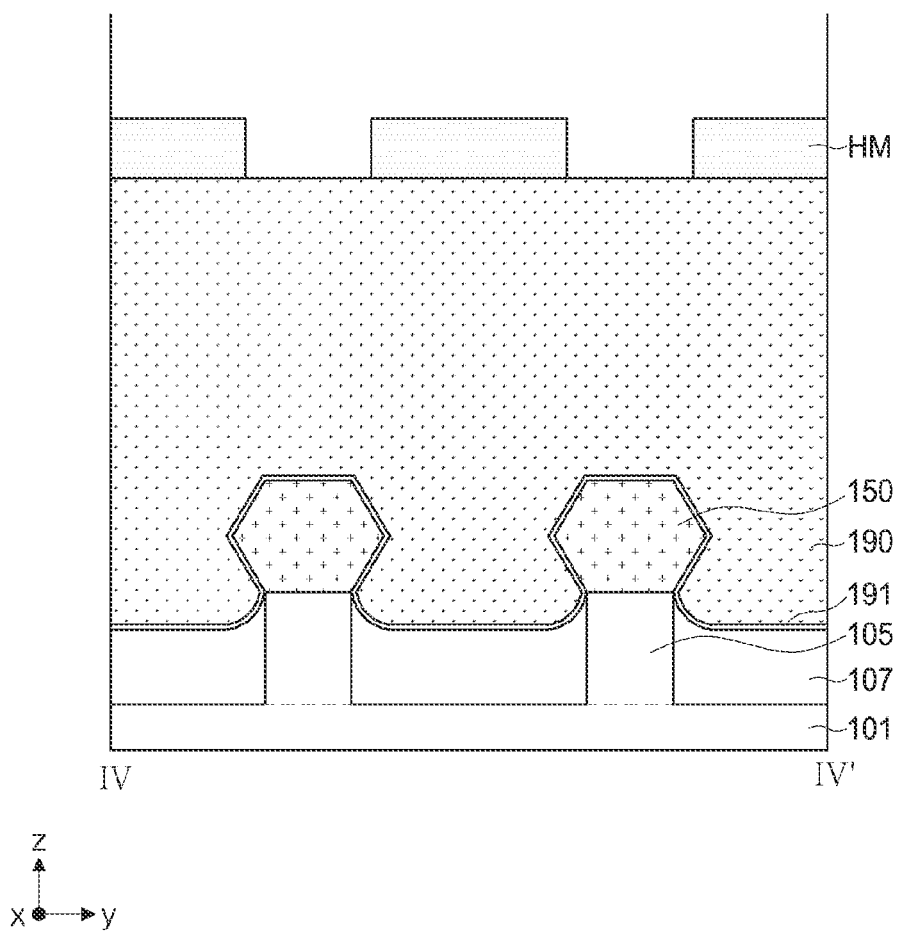

In an example embodiment, the gate structures 160 may include a first gate structure 160a and a second gate structure 160b that are spaced apart from each other and extend in parallel. Referring to FIGS. 16 and 17A, the first gate structure 160a may be a gate structure including an upper surface that is covered by the hard mask HM in the hard mask HM forming operation, and the second gate structure 160b may be a gate structure including an upper surface that includes at least a portion not covered by the hard mask HM. In an example embodiment, the number of the first gate structure 160a and the second gate structure 160b may be plural. For example, referring to FIG. 16, it is illustrated that two second gate structures 160b are disposed between adjacent first gate structures 160a, but the number of second gate structures 160b may be variously changed by changing the size of the hard mask HM. The upper surface of the upper capping layer 167 of the first gate structure 160a may be disposed on substantially the same level as the upper surface of the upper capping layer 167 of the second gate structure 160b.

In an example embodiment, the semiconductor device 100 may further include inner spacer layers disposed in parallel with the gate electrode 165, between the channel layers 140. The gate electrode 165 positioned below an uppermost channel layers 140 among the channel layers 140 may be spaced apart from the source/drain regions 150 by the inner spacer layers and be electrically separated therefrom. The inner spacer layers may have a shape in which a side surface facing the gate electrode 165 is convexly rounded inwardly toward the gate electrode 165, but the shape is not limited thereto. The inner spacer layers may be formed of oxide, nitride, and oxynitride, and in detail, may be formed of a low-K film. In some embodiments, the inner spacer layers may be omitted.

The contact plugs 170 and 180 may include a first contact plug 170 connected to the source/drain regions 150 and a second contact plug 180 connected to the gate structures 160.

Figure 6:
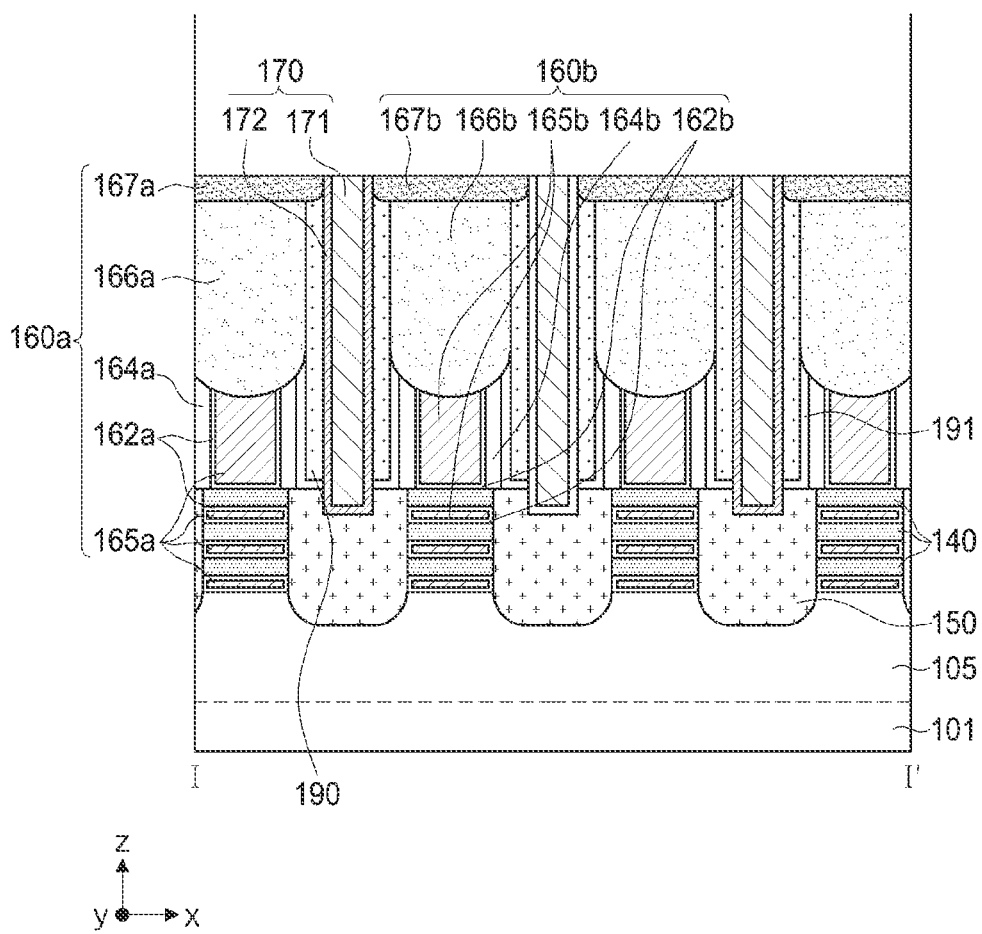
FIG. 6 is a cross-sectional view illustrating a semiconductor device according to example embodiments.

The first contact plug 170 may penetrate through the interlayer insulating layer 190 to be connected to the source/drain regions 150, and may apply an electrical signal to the source/drain regions 150. The first contact plug 170 may be disposed on the source/drain regions 150 as illustrated in FIG. 1, and may also be disposed to have a length greater than that of the source/drain regions 150 in the Y direction in some embodiments. The first contact plug 170 may have an inclined side surface of which a width decreases in a direction toward the substrate 101 according to an aspect ratio, but the configuration is not limited thereto. When the first contact plug 170 has the inclined side surface, the first contact plug 170 may have the width that decreases toward the substrate 101 by setting an interval between the upper capping layers 167 of the adjacent gate structures 160 as a maximum width (e.g., a widest width) of the first contact plug 170. The first contact plug 170 may be recessed by a predetermined depth from the source drain regions 150, but the configuration is not limited thereto. In example embodiments, the first contact plug 170 may also be disposed to contact along upper surfaces of the source/drain regions 150 without recessing the source/drain regions 150. In some embodiments, a widest width of the first contact plug 170 in the X direction may be equal to a distance in the X direction between the upper capping layers of directly adjacent gate structures 160 as illustrated in FIG. 6. As used herein, directly adjacent elements A" (or similar language) may refer to two elements A between which no element A is located. For example, the first and second upper capping layers 167a and 167b contacting the first contact plug 170 are directly adjacent, as no upper capping layer is located therebetween.

The first contact plug 170 may be disposed between the adjacent gate structures 160 to extend to the source/drain regions 150, to contact the source/drain regions 150. In an example embodiment, the first contact plug 170 may be extended to the source/drain regions 150, between the adjacent first and second gate structures 160a and 160b and/or between the adjacent second gate structures 160b.

The first contact plug 170 may be a self-aligning contact (SAC) aligned by the gate structures 160. The first contact plug 170 may be aligned by the upper capping layer 167 and the lower capping layer 166 of the adjacent gate structures 160. The first contact plug 170 may cover at least one side of the upper capping layer 167 and the lower capping layer 166 and may penetrate through the interlayer insulating layer 190 to be connected to the source/drain regions 150. For example, at least a portion of the first contact plug 170 may contact the upper capping layer 167 and the lower capping layer 166. Accordingly, the first contact plug 170 may extend along at least one side of the capping layers 166 and 167 in the Z direction, perpendicular to the substrate 101.

The first contact plug 170 may include a first plug layer 171 and a first barrier layer 172. The first plug layer 171 may include, for example, a metal nitride such as a titanium nitride film (TiN), a tantalum nitride film (TaN), or a tungsten nitride film (WN), and/or a metal material such as aluminum (Al), tungsten (W), or molybdenum (Mo). The first barrier layer 172 may conformally cover side and bottom surfaces of the first plug layer 171. The first barrier layer 172 may include, for example, a metal nitride such as a titanium nitride film (TiN), a tantalum nitride film (TaN), or a tungsten nitride film (WN).

The second contact plug 180 may be connected to the gate electrode 165 penetrating through the capping layers 166 and 167, and may apply an electrical signal to the gate electrode 165. The second contact plug 180 may have a side surface that is convex while penetrating into the upper capping layer 167. The second contact plug 180 may have a convex side surface that is curved toward the upper capping layer 167 as illustrated in FIGS. 2B and 2C. For example, in the second contact plug 180, the planar area of a portion passing through the level between the upper surface and the lower surface of the upper capping layer 167 may be greater than the planar area of a portion penetrating through the upper surface or the lower surface of the upper capping layer 167. The convex side surface may be a structure obtained by a wet etching process on the upper capping layer 167. The second contact plug 180 may not include a convex side surface that is convex while penetrating through the lower capping layer 166. For example, the etching process for the lower capping layer 166 may be different from the etching process for the upper capping layer 167, and thus, the side surface of the second contact plug 180 penetrating through the lower capping layer 166 may have a structure different from that of the side surface of the second contact plug 180 penetrating through the upper capping layer 167. In an example embodiment, the side surface of the second contact plug 180 penetrating through the lower capping layer 166 may have a straight shape perpendicular to the substrate 101, but the configuration is not limited thereto. For example, the side surface of the second contact plug 180 penetrating through the lower capping layer may have an inclined side surface of which the width of the lower portion becomes narrower than the width of the upper portion according to the aspect ratio.

The second contact plug 180 may recess the gate electrode 165 by a predetermined depth, but the configuration is not limited thereto. In example embodiments, the second contact plug 180 may be disposed to contact along the upper surface of the gate electrode 165 without recessing the gate electrode 165.

According to an example embodiment, the second contact plug 180 may be disposed in various positions on the gate structures 160, unlike that illustrated in FIG. 1.

The second contact plug 180 may include a second plug layer 181 and a second barrier layer 182. The second plug layer 181 may include, for example, a metal nitride film such as a titanium nitride film (TiN), a tantalum nitride film (TaN), or a tungsten nitride film (WN), and/or a metallic material such as aluminum (Al), tungsten (W), or molybdenum (Mo). The second barrier layer 182 may conformally cover side and lower surfaces of the second plug layer 181. The second barrier layer 182 may include, for example, a metal nitride such as a titanium nitride film (TiN), a tantalum nitride film (TaN), or a tungsten nitride film (WIN). The second plug layer 181 may include the same material as the first plug layer 171, and the second barrier layer 182 may include the same material as the second barrier layer 172.

The interlayer insulating layer 190 covers the source/drain regions 150 and the gate structures 160, and may be disposed to cover the device isolation layers 107 in a region not illustrated. The interlayer insulating layer 190 may include, for example, at least one of an oxide, a nitride, and an oxynitride, and may include a low-k material.

In an example embodiment, the semiconductor device 100 may further include an insulating liner 191 covering a lower surface of the interlayer insulating layer 190. The insulating liner 191 may include a material different from that of the interlayer insulating layer, for example, silicon nitride or a silicon nitride-based insulating material. The insulating liner 191 may be disposed between the device isolation layers 107 and the interlayer insulating layer 190 and may extend to surfaces of the source/drain regions 150 not in contact with the first contact plug 170. In addition, the insulating liner 191 may extend on side surfaces of the gate structures 160.

In an example embodiment, a lower surface of the lower capping layer 166 may cover the gate electrode 165, the spacer structure 164, and the insulating liner 191 extending on side surfaces of the spacer structure 164. The lower capping layer 166 may include a lower surface having a convex shape that is convex toward the substrate 101. The width of the lower capping layer 166 in the X-direction may be equal to or similar to the sum of widths of the gate electrode 165, the spacer structures 164 disposed on both sidewalls of the gate electrode, and the insulating liner 191 disposed on both sidewalk of the spacer structures 164 in the X-direction, but is not limited thereto.

In an example embodiment, the semiconductor device 100 may include a first transistor TR1 including a first active region 105*a*, the first channel layers, a first source/drain region 150*a*, and gate structures 160, and a second transistor TR2 including a second active region 105*b*, the second channel layers, a second source/drain region 150*b*, and gate structures 160. One of the first and second transistors TR1 and TR2 may be an NMOS transistor region, and the other may be a PMOS transistor region.

In the first and second transistors TR1 and TR2, the active regions 105 may have a fin structure, and the gate electrode 165 may be disposed between the active regions 105 and the channel layers 140, between adjacent channel layers 140, and above the channel layers 140. Accordingly, the first and second transistors TR1 and TR2 may be a transistor of a multi-bridge channel FET (MBCFET™) structure that is gate-all-around (GAA)-type field effect transistor formed by the channel layers 140, the source/drain regions 150, and the gate structures 160.

However, unlike the descriptions described above according to an example embodiment, in the first and second transistors TR1 and TR2, the active regions 105 may have a fin structure, and the gate electrode 165 may cover the active regions and the upper surface and the side surface of a single channel layer disposed on the active regions 105. Accordingly, the first and second transistors TR1 and TR2 may also be fin-type field effect transistors formed by the single channel layer, the source/drain regions 150, and the gate structures 160.

Figure 3:
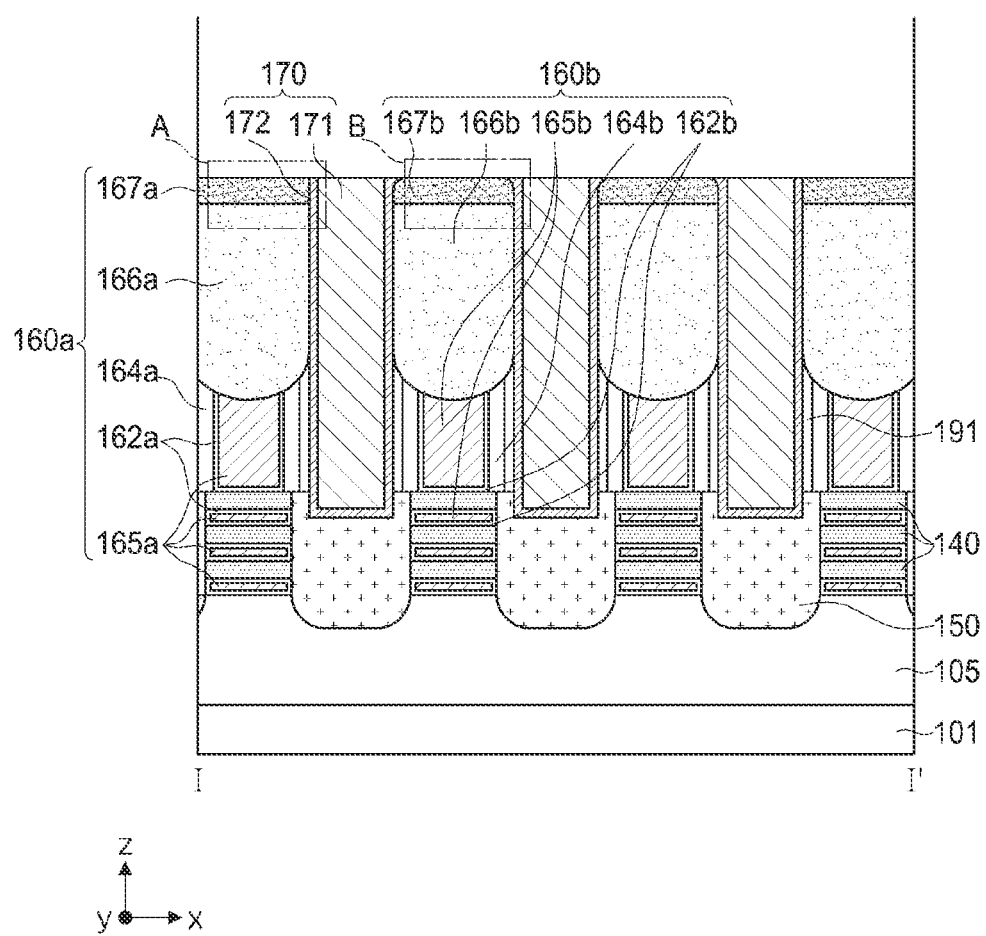
FIG. 3 is a cross-sectional view illustrating a semiconductor device according to example embodiments.
Figure 4A:
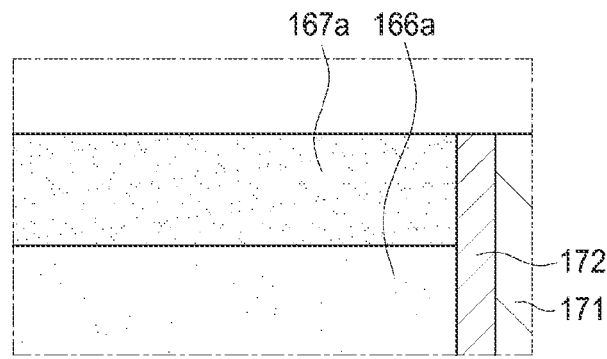
FIGS. 4A and 4B are enlarged views illustrating a portion of a semiconductor device according to example embodiments.
Figure 4B:
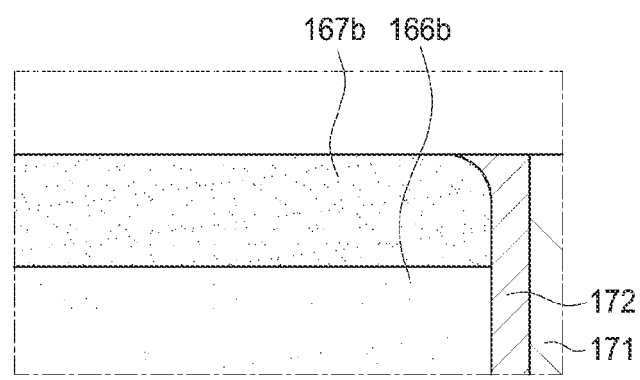

FIG. 3 is a cross-sectional view illustrating a semiconductor device 100*a* according to example embodiments. FIG. 3 illustrates a region corresponding to a cross-section taken along line I-I' of FIG. 1. FIGS. 4A and 4B are enlarged views illustrating a portion of a semiconductor device 100*a* according to example embodiments. FIGS. 4A and 4B are enlarged views of area 'A' and area 'B' of FIG. 3.

Referring to FIGS. 3, 4A and 4B, the semiconductor device 100*a* may include a structure of the upper capping layer 167 different from that of FIGS. 1 to 2D. The first gate structure 160*a* may include a first upper capping layer 167*a*, and the second gate structure 160*b* may include a second upper capping layer 1671). The first upper capping layer 167*a* and the second upper capping layer 167*b* may include the same material. The first upper capping layer 167*a* and the second upper capping layer 167*b* may have different shapes. In an example embodiment, the upper surface of the first upper capping layer 167*a* may have an angled corner, and the upper surface of the second upper capping layer 167*b* may have a rounded corner. In some embodiments, the first upper capping layer 167*a* may include an angled upper corner, and the second upper capping layer 167*b* may a rounded upper corner. Referring to FIGS. 17A and ISA, the upper surface of the first upper capping layer 167*a* is protected by a hard mask HM, and is not etched, but the upper surface of the second upper capping layer 167*b* may be exposed and etched. The second upper capping layer 167*b* may include a material having relatively high etch resistance such that only the corner of the second upper capping layer 167*b* may be etched, thereby including the rounded corner. Accordingly, the thickness (e.g., the thickest thickness) of the first upper capping layer 167*a* in the Z direction may be substantially the same as the thickness (e.g., the thickest thickness) of the second upper capping layer 167*b* in the Z direction. However, according to an example embodiment, even in the case in which a portion of the upper surface of the second upper capping layer 167*b* is etched together with the corner, the first upper capping layer 167*a* and the second upper capping layer 167*b* may have substantially the same thickness in a subsequent process such as a planarization process or the like. Even in this case, the second upper capping layer 167*b* may have a shape different from that of the first upper capping layer 167*a* by including the rounded corner.

Figure 5:
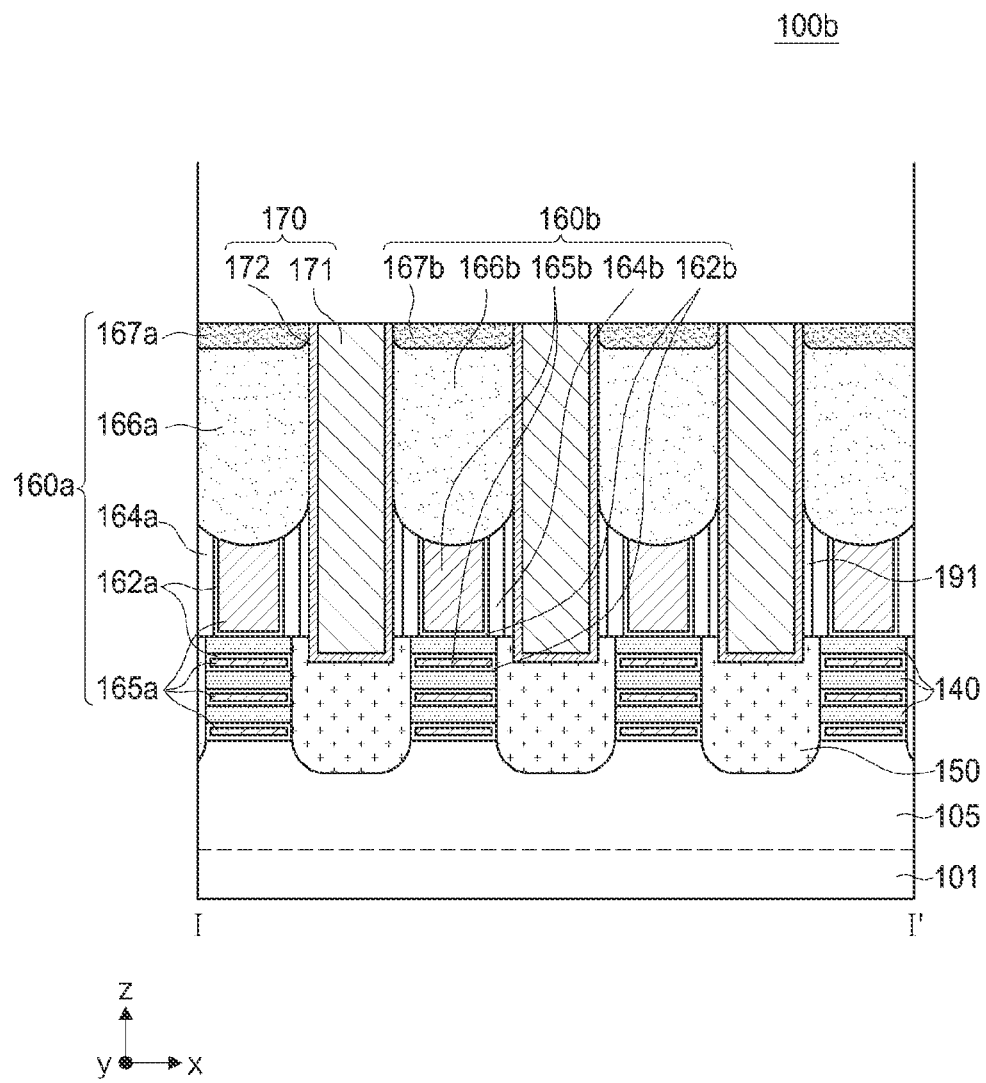
FIG. 5 is a cross-sectional view illustrating a semiconductor device according to example embodiments.

FIG. 5 is a cross-sectional view illustrating a semiconductor device 100*b* according to example embodiments. FIG. 5 illustrates a region corresponding to a cross-section taken along line I-I' of FIG. 1.

Referring to FIG. 5, the semiconductor device 100*b* may include gate structures 160 having rounded corners on the lower surface of the upper capping layer 167. The upper capping layer 167 may include a rounded lower corner. The upper capping layer 167 may be disposed on the lower capping layer 166 while covering the upper surface of the lower capping layer 166. The lower capping layer 166 may extend along the rounded corner of the upper capping layer 167 and may contact the lower surface of the upper capping layer 167. A first width of the upper capping layer 167 in the X-direction may be substantially the same as a second width of the lower capping layer 166 in the X-direction. Accordingly, the side surface of the upper capping layer 167 and the side surface of the lower capping layer 166 may be coplanar. The first width of the upper capping layer 167 in the X-direction may be a widest width of the upper capping layer 167 in the X-direction, and the second width of the lower capping layer 166 in the X-direction may be a widest width of the lower capping layer 166 in the X-direction.

In an example embodiment, the semiconductor device 100a of FIG. 3 may further include the structure of the upper capping layer 167 of FIG. 5. For example, the first upper capping layer 167a and the second upper capping layer 167b may have upper surfaces having different shapes and lower surfaces having the same rounded corner, respectively.

FIG. 6 is a cross-sectional view illustrating a semiconductor device 100c according to example embodiments. FIG. 6 illustrates a region corresponding to a cross-section taken along line I-I' of FIG. 1.

Referring to FIG. 6, the semiconductor device 100c may include gate structures 160 in which the width of the lower capping layer 166 in the X-direction is different from that of the upper capping layer 167 in the X-direction. A first width of the upper capping layer 167 in the X-direction may be greater than a second width of the lower capping layer 166 in the X-direction. Accordingly, the capping layers 166 and 167 may further include a step disposed between the upper capping layer 167 and the lower capping layer 166. The first contact plug 170 may penetrate through the interlayer insulating layer 190 along the side surface of the upper capping layer 167, to be connected to the source/drain regions 150. As the first contact plug 170 extends along the side surface of the upper capping layer 167, the first contact plug 170 may not contact the lower capping layer 166 having a width smaller than that of the upper capping layer 167. For example, the first contact plug 170 may be disposed to be spaced apart from the lower capping layer 166 while in contact with the side surface of the upper capping layer 167. As the width of the upper capping layer 167 in the X-direction increases compared to the semiconductor device 100 of FIG. 2A to 2D, a distance between adjacent gate structures 160 may become narrower. Accordingly, the first contact plug 170 may extend to the source/drain regions 150, between the gate structures 160 disposed at a closer distance, to have a narrower width than that of the first contact plug of FIG. 2A to 2D. In an example embodiment, the first contact plug 170 may include an inclined side surface of which the width decreases in a direction toward the substrate 101 according to an aspect ratio, and may have the width further decreasing toward the substrate 101 by setting the interval between the upper capping layers 167 of adjacent gate structures 160 to be a maximum width.

Figure 7:
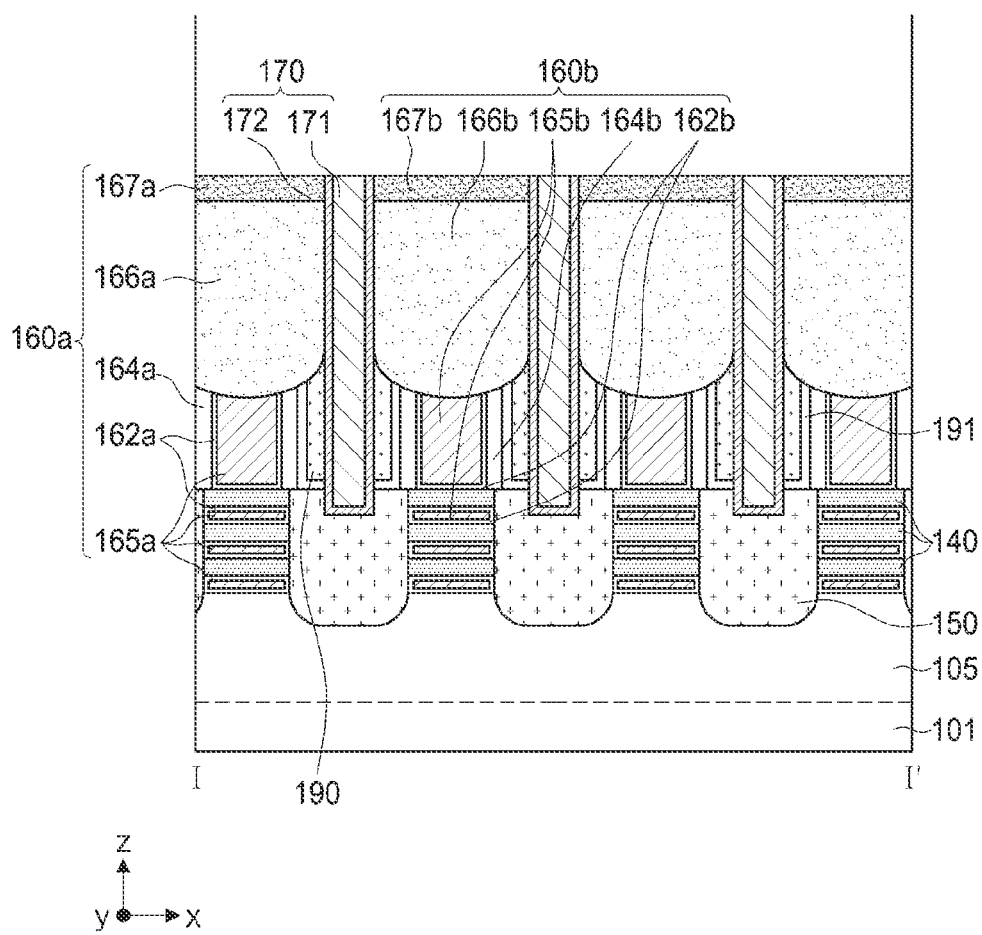
FIG. 7 is a cross-sectional view illustrating a semiconductor device according to example embodiments.

FIG. 7 is a cross-sectional view illustrating a semiconductor device 100d according to example embodiments. FIG. 7 illustrates a region corresponding to a cross section taken along line I-I' of FIG. 1.

Referring to FIG. 7, in the semiconductor device 100d, the capping layers 166 and 167 may penetrate through at least portions of the gate electrode 165, the spacer structure 164, and the interlayer insulating layer 190. Unlike the semiconductor device 100 of FIG. 2A to 2D, a lower surface of the lower capping layer 166 may be surrounded by the interlayer insulating layer 190 as well as the gate electrode 165 and the spacer structure 164. In an example embodiment, the widths of the lower capping layer 166 and the upper capping layer 167 in the X-direction may be the same, but in some embodiments, as illustrated in FIG. 6, the widths of the lower capping layer 166 and the upper capping layer 167 in the X-direction may be different.

FIGS. 8 to 19 are views illustrating a method of manufacturing a semiconductor device according to example embodiments. FIGS. 8 to 19 illustrate a method of manufacturing the semiconductor device 100 of FIGS. 1 to 2D.

FIGS. 8, 12, 16, and 19 are plan views illustrating a method of manufacturing a semiconductor device according to example embodiments. FIGS. 9A, 10A, 11A, 13A, 14A, 15A, 17A, and 18 are cross-sectional views illustrating a region taken along line of FIGS. 1, 8, 16, and 19. FIGS. 9B, 11B, FIGS. 13B, 14B, 15B, and 17B are cross-sectional views illustrating a region taken along line II-II' of FIGS. 1, 8, 12, 16, and 19. FIGS. 9C, 11C, 13C, 14C, 15C, and 17C are cross-sectional views illustrating a region taken along line III-III' of FIGS. 1, 8, 12, 16, and 19. FIGS. 9D, 10B, 11D, and FIG. 17D are cross-sectional views illustrating a region taken along line IV-IV' of FIGS. 1, 8, 12, 16, and 19.

Referring to FIGS. 8, 9A, 9B, 9C, and 9D, active structures 105, 111 and 140 may be formed on a substrate 101, sacrificial gate structures SG intersecting the active structures 105, 111 and 140 may be formed, and spacer structures 164 may be formed on both sidewalls of the sacrificial gate structures SG.

The sacrificial layers 111 and the channel layers 140 are alternately stacked on the substrate 101, and the sacrificial layers 111, the channel layers 140, and at least a portion of the substrate 101 may be etched to form a trench defining the active regions 105, thereby forming the active structures 105, 111, and 140. The active structures 105, 111, and 140 may include the active regions 105, and the sacrificial layers 111 and the channel layers 140 alternately stacked on the active regions 105.

The sacrificial layers 111 and the channel layers 140 may be formed by an epitaxial growth process. The sacrificial layers 111 may be a layer replaced by the gate dielectric layer 162 and the gate electrode 165 as illustrated in FIG. 2A through a subsequent process. The sacrificial layers 111 may be formed of a material having etch selectivity with respect to the channel layers 140 in predetermined etch condition. The sacrificial layers 111 and the channel layers 140 include, for example, a semiconductor material including at least one of silicon (Si), silicon germanium (SiGe), and germanium (Ge), but may include different materials. The sacrificial layers 111 may include, for example, silicon germanium (SiGe), and the channel layers 140 may include silicon (Si). In an example embodiment, three channel layers 140 may be stacked to have substantially the same thickness, but the present inventive concept is not limited thereto, and the number and thickness of the channel layers may be variously changed according to example embodiments.

The active regions 105 may be regions defined by the trench. The active regions 105 may be regions formed to protrude from the upper surface of the substrate 101 by removing a portion of the substrate 101. The active regions 105 may have a shape protruding in the Z direction perpendicular to the substrate 101, and may be formed of the same material as the substrate 101. The active regions 105 may be formed in a line shape extending in one direction, for example, the X-direction, and may be disposed to be spaced apart from each other in the Y-direction.

In an example embodiment, the active structures 105, 111, and 112 may include a first active structure and a second active structure spaced apart from each other in the Y-direction. The first active structure may include a first active region 105a, and first sacrificial layers and first channel layers alternately stacked on the first active region 105a, and the second active structure may include a second active region 105b, and second sacrificial layers and second channel layers alternately stacked on the second active region 105b. The first active region 105a and the second active region 105b may have different conductivity types. The first channel layers and the second channel layers may have different conductivity types. The first active region 105a and the first channel layers may have the same conductivity type, and the second active region 105b and the second channel layers may also have the same conductivity type. In an example embodiment, the first active region 105a may have an N-type conductivity type and the second active region 105b may have a P-type conductivity type.

In the region in which the substrate 101 has been partially removed, the device isolation layers 107 may be formed by filling the region with the insulating material and then partially removing the insulating material such that the active regions 105 protrude upwardly beyond the device isolation layers 107. The device isolation layers 107 may be formed to cover some side surfaces of the active regions 105. An upper surface of the device isolation layers 107 may be formed to be lower than an upper surface of the active regions 105. The device isolation layers 107 may include silicon oxide.

Next, sacrificial gate structures SG, which traverse the active structures 105, 111, and 140 and are parallel to each other, may be formed. Each of the sacrificial gate structures SG may have a line shape extending in one direction, for example, the Y-direction. The sacrificial gate structures SG may be sacrificial structures formed in a region in which the gate dielectric layer 162 and the gate electrode 165 are disposed on the channel layers 140 as illustrated in FIG. 2A, through a subsequent process. The sacrificial gate structures SG may include a sacrificial gate layer SGL and a sacrificial gate capping layer SGC. The sacrificial gate layer SGL may be formed of, for example, polysilicon, and the sacrificial gate capping layer SGC may be formed of a silicon nitride layer.

In an example embodiment, each of the sacrificial gate structures SG may further include a sacrificial gate insulating layer disposed below the sacrificial gate layer SGL. The sacrificial gate insulating layer may be formed of a material having an etch selectivity with respect to the sacrificial gate layer SG-L, and may be formed of one of, for example, thermal oxide, silicon oxide, and silicon nitride.

Next, spacer structures 164 may be formed on both sidewalls of the sacrificial gate structures SG. The spacer structure 164 may contact a side surface of the sacrificial gate insulating layer. The spacer structure 164 may be formed by forming a film having a uniform thickness along the sacrificial gate structures SG and the upper and side surfaces of the active structures 105, 111 and 140, and then performing anisotropic etching. The spacer structure 164 may include an insulating material, for example, at least one of SiO, SiN, SiCN, SiOC, SiON, and SiOCN.

Figure 8:
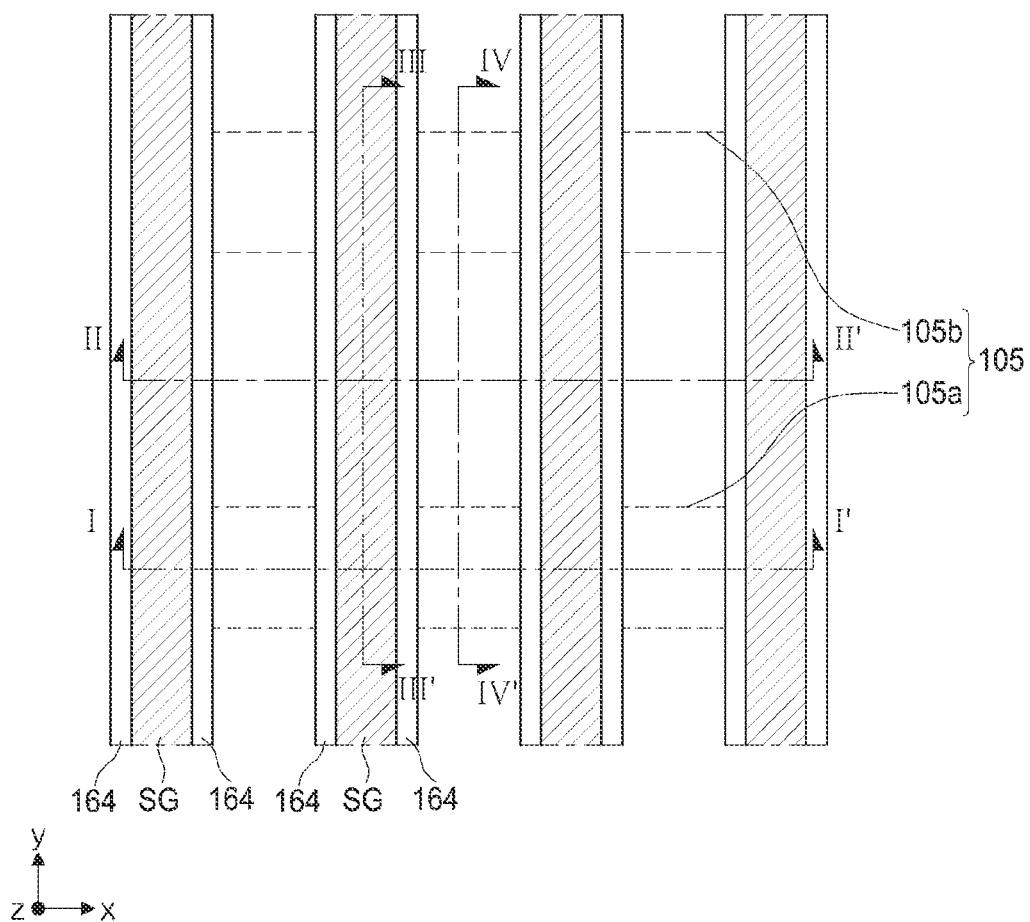
FIGS. 8, 9A through 9D, 10A, 10B, 11A through 11D 12, 13A through 13C, 14A, 14B, 15A through 15C, 16, 17A through 17D, 18 and 19 are views illustrating a method of manufacturing a semiconductor device according to example embodiments.
Figure 9A:
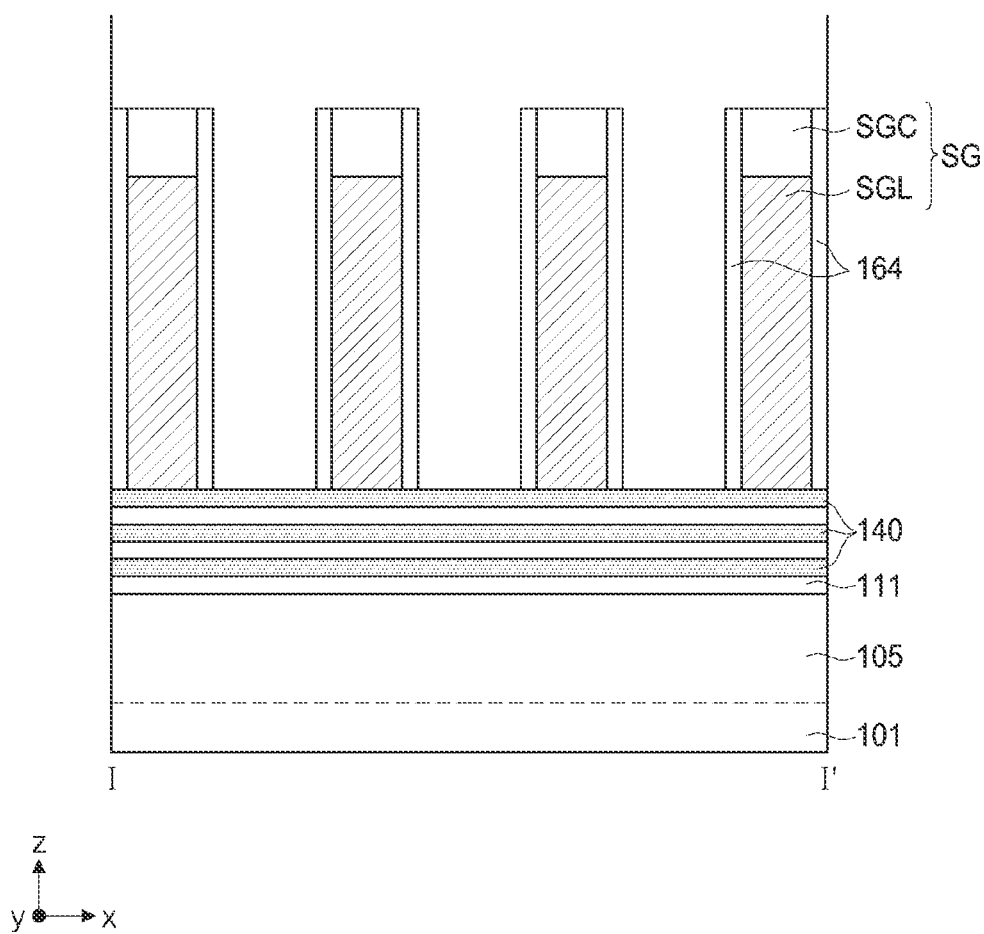
Figure 9B:
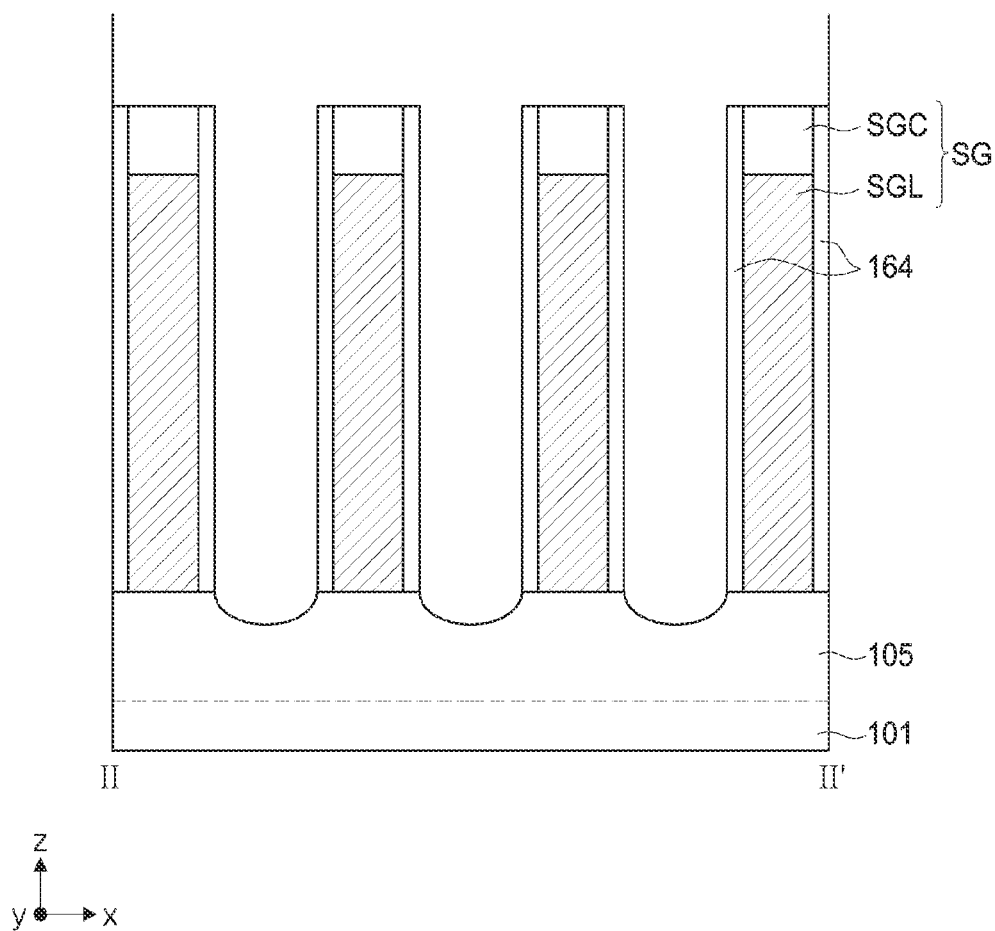
Figure 9C:
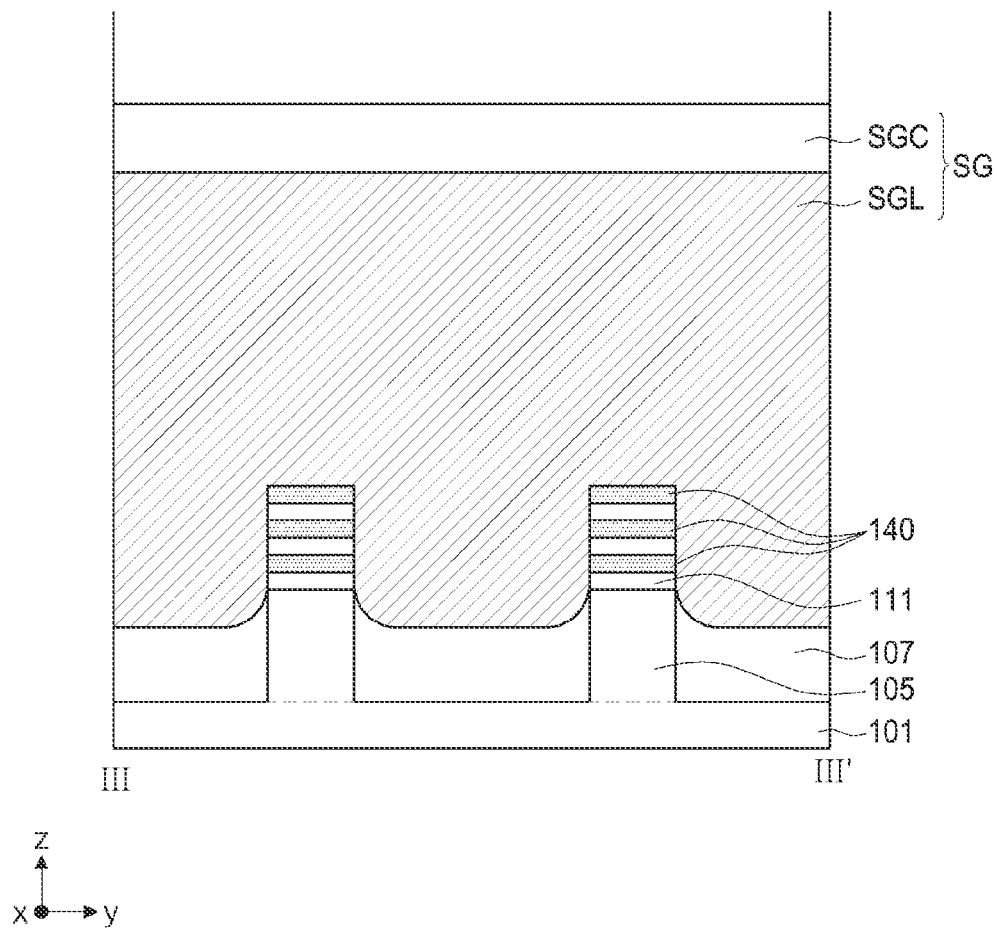
Figure 9D:
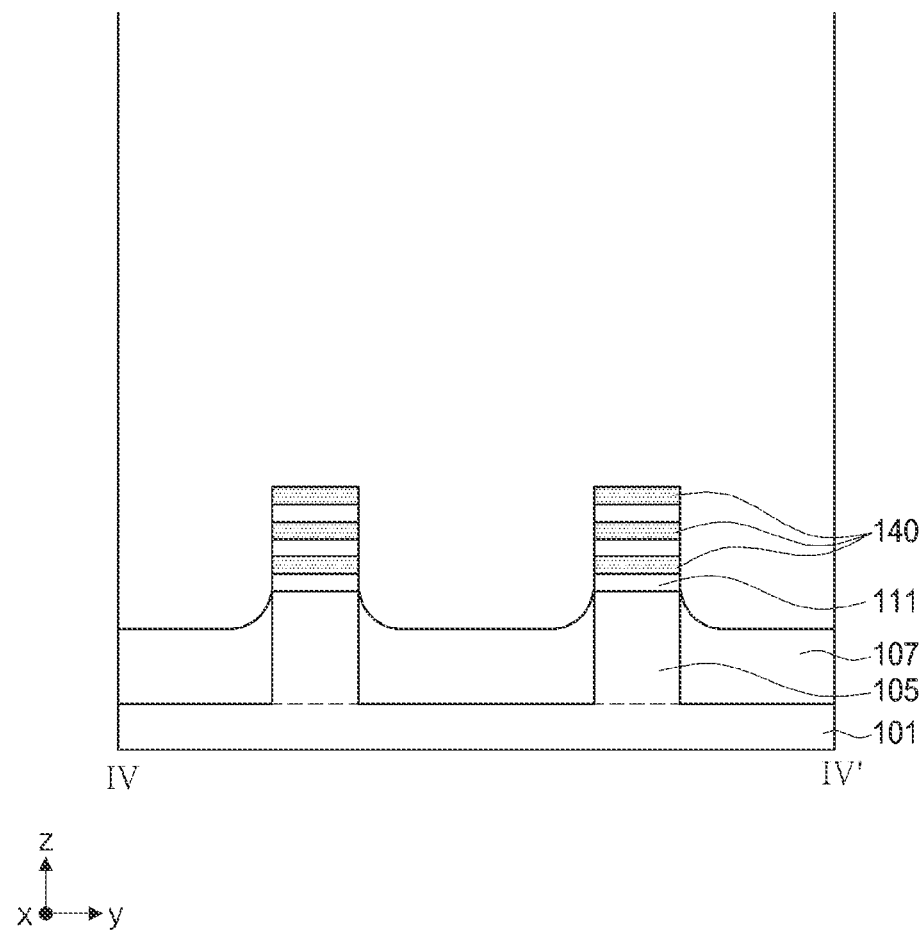
Figure 10A:
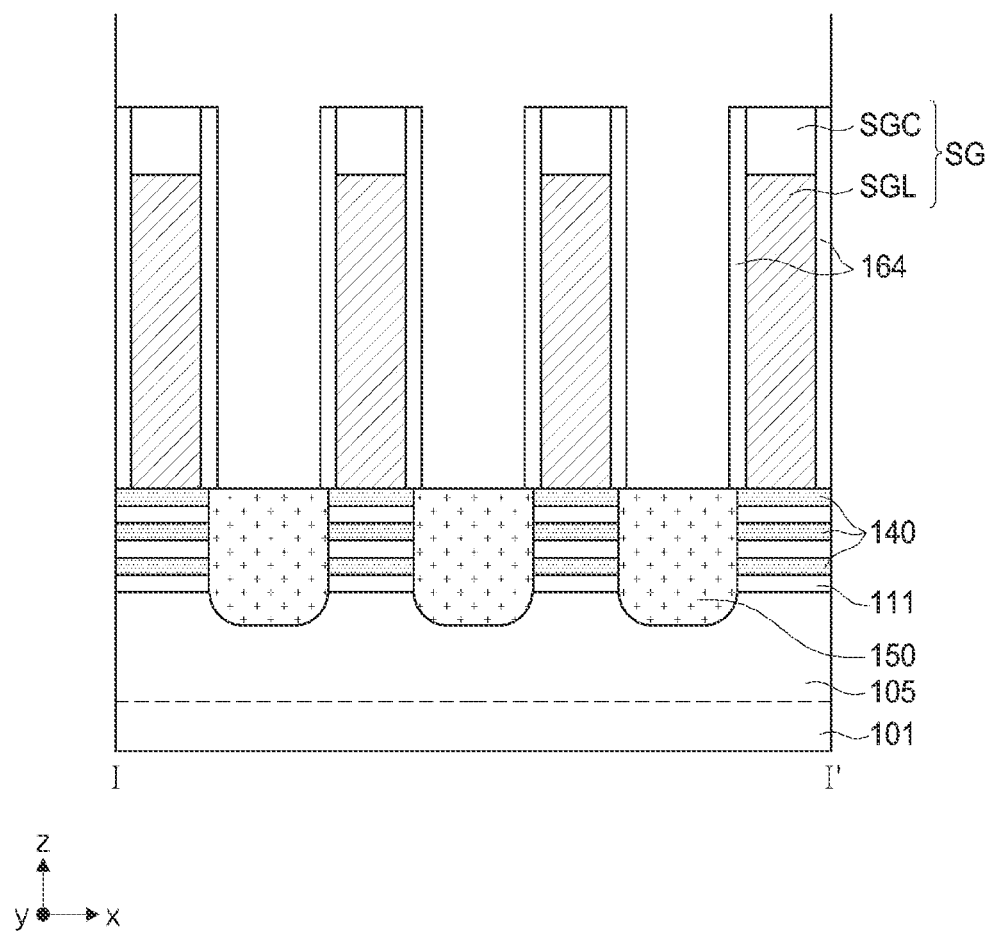
Figure 10B:
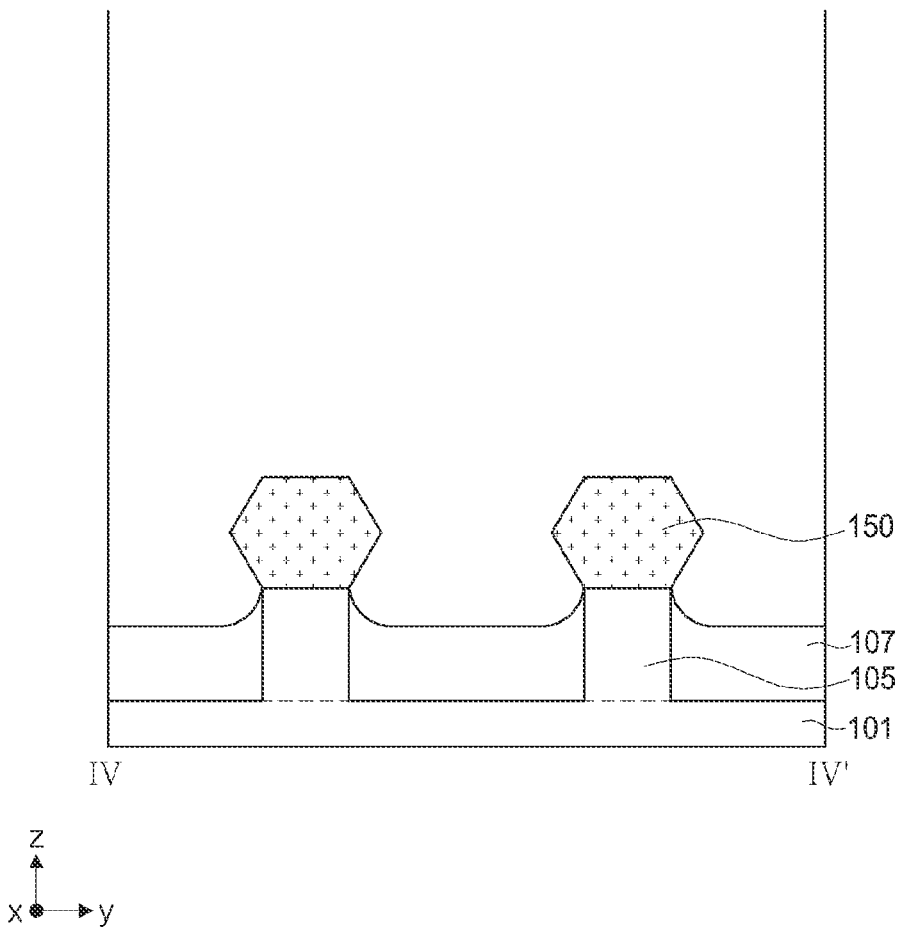
Figure 11A:
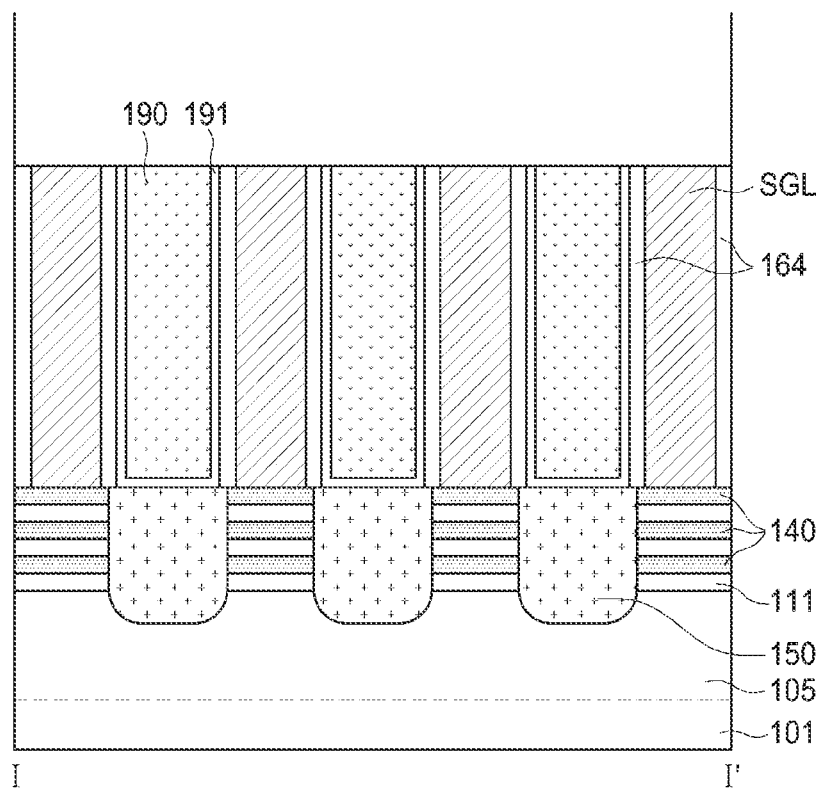
Figure 11B:
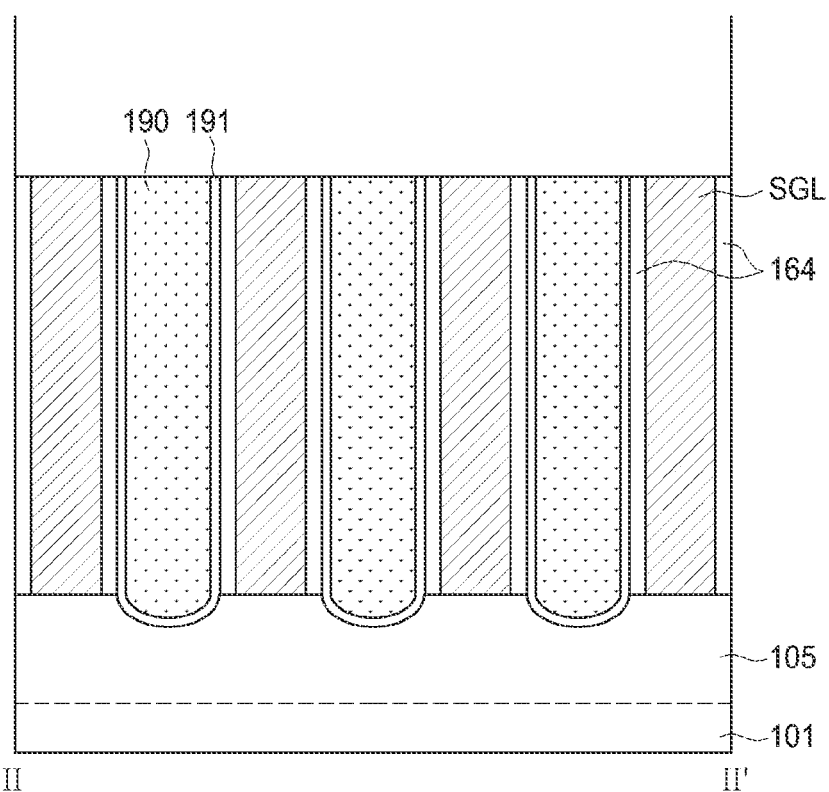
Figure 11C:
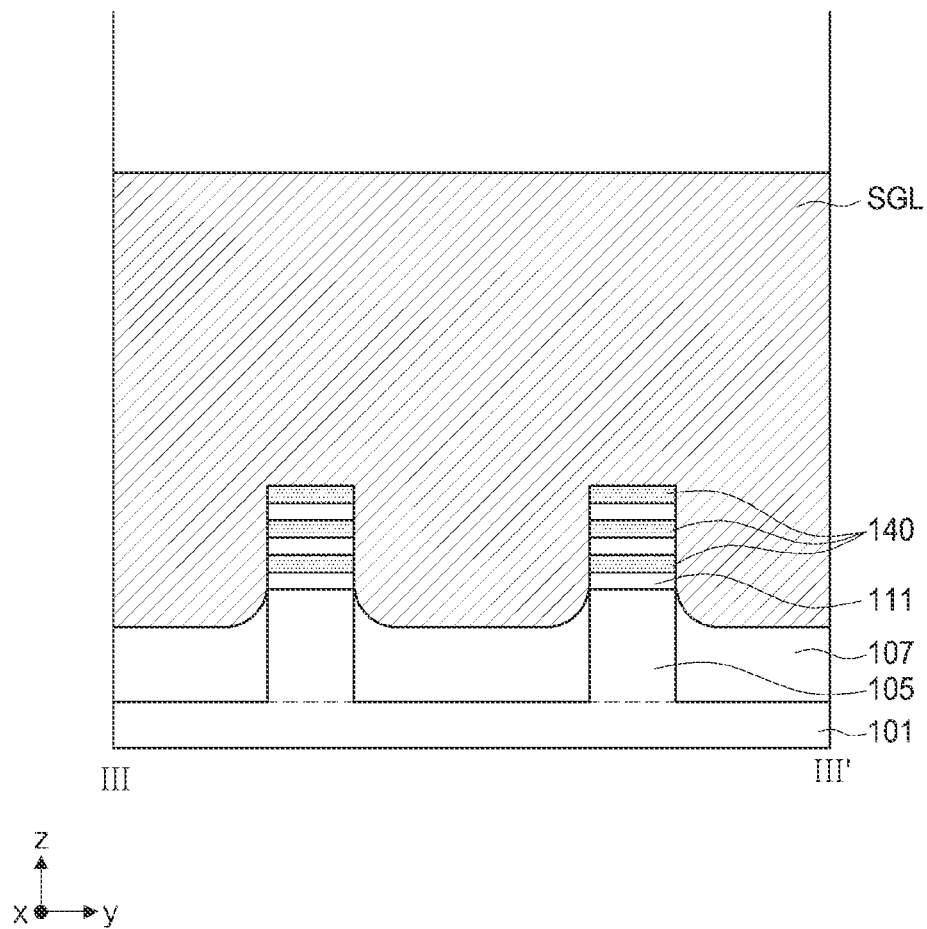
Figure 11D:
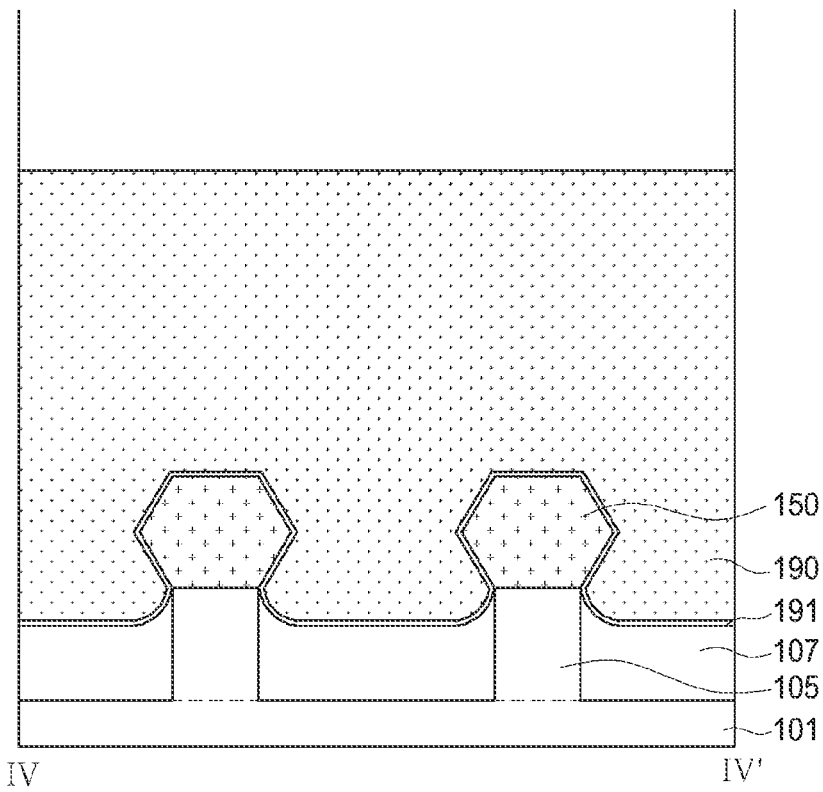
Figure 12:
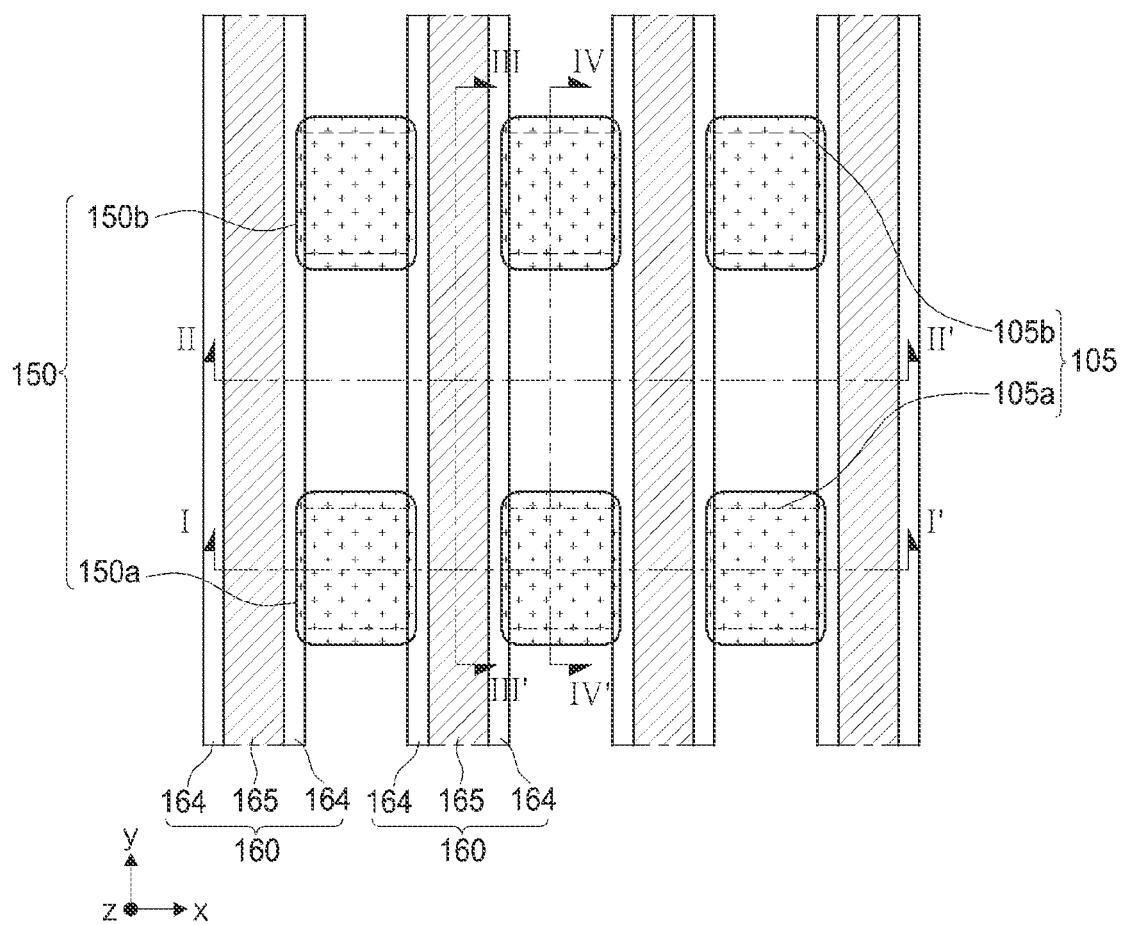
Figure 13A:
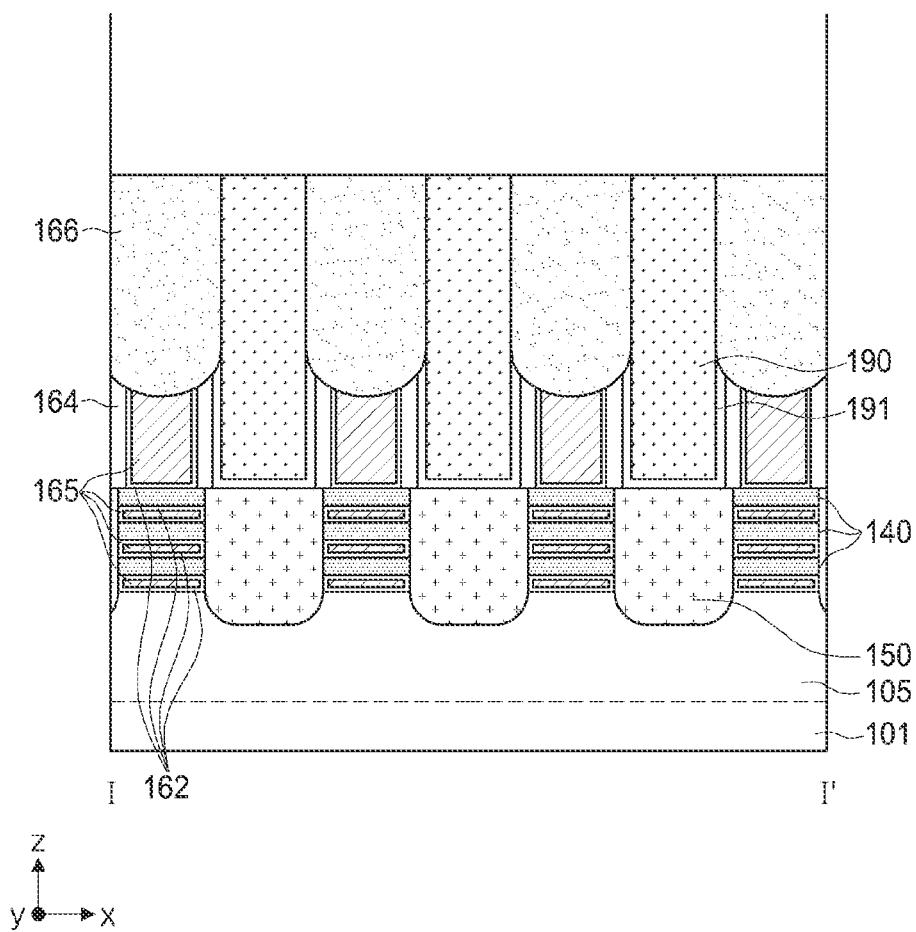
Figure 13B:
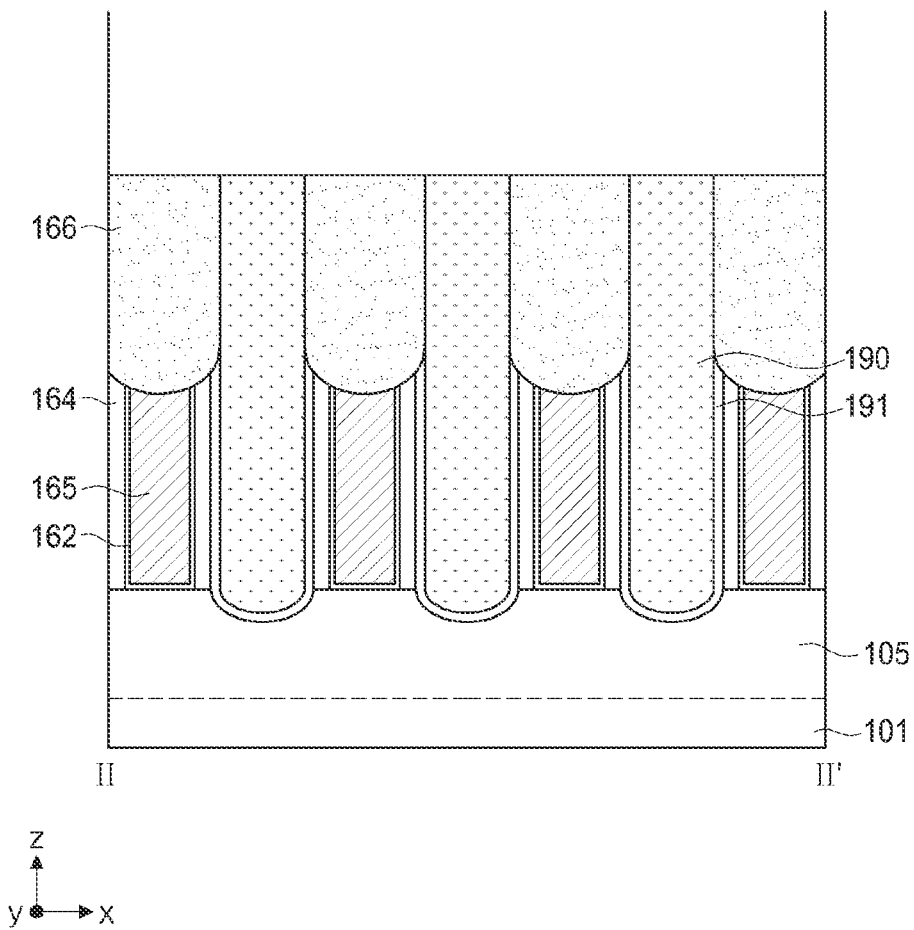
Figure 13C:
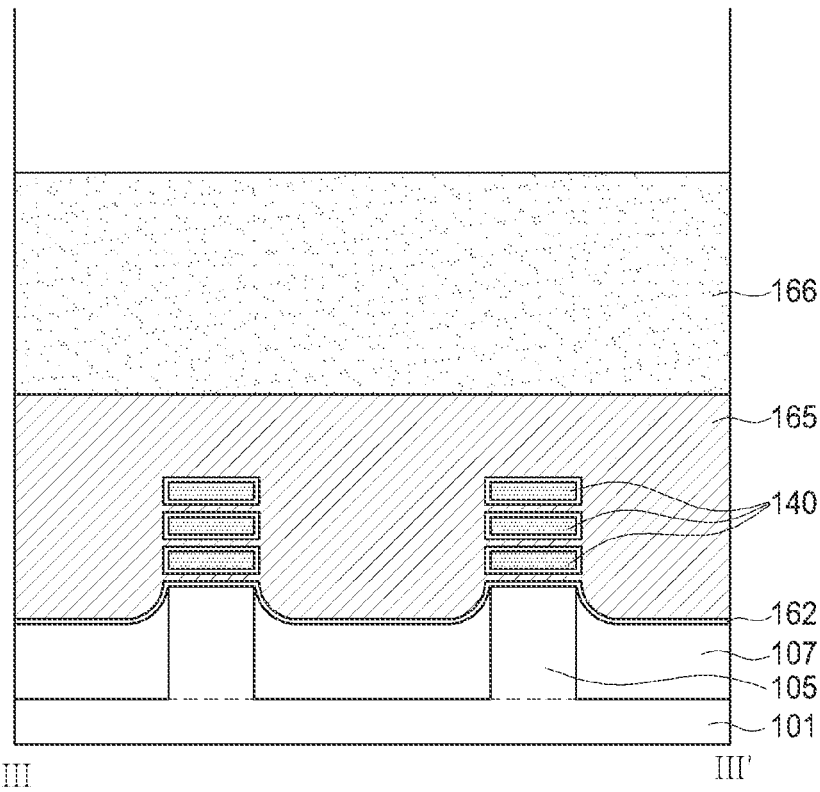
Figure 14A:
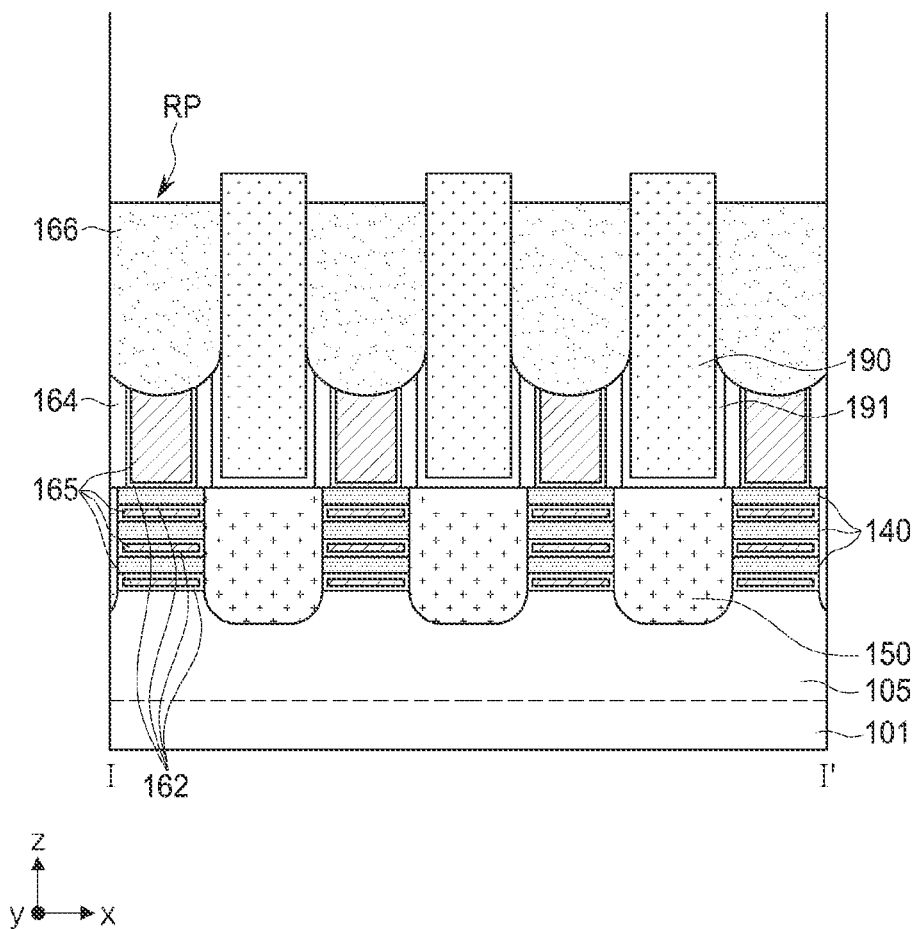
Figure 14B:
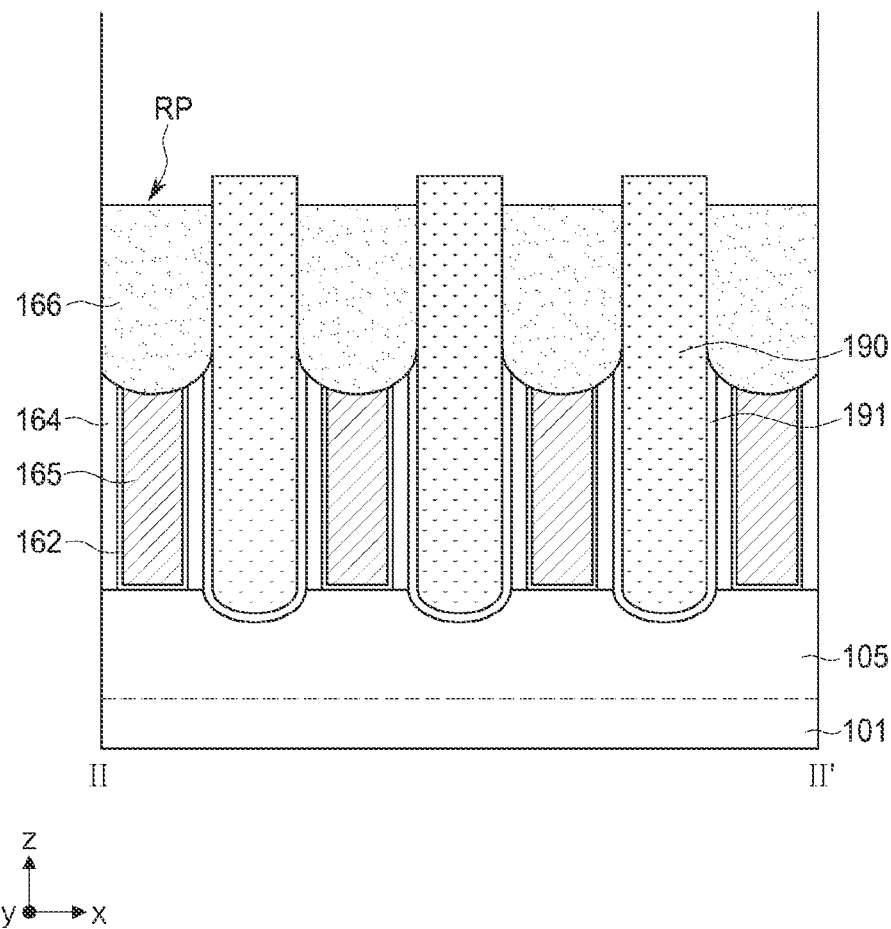
Figure 15A:
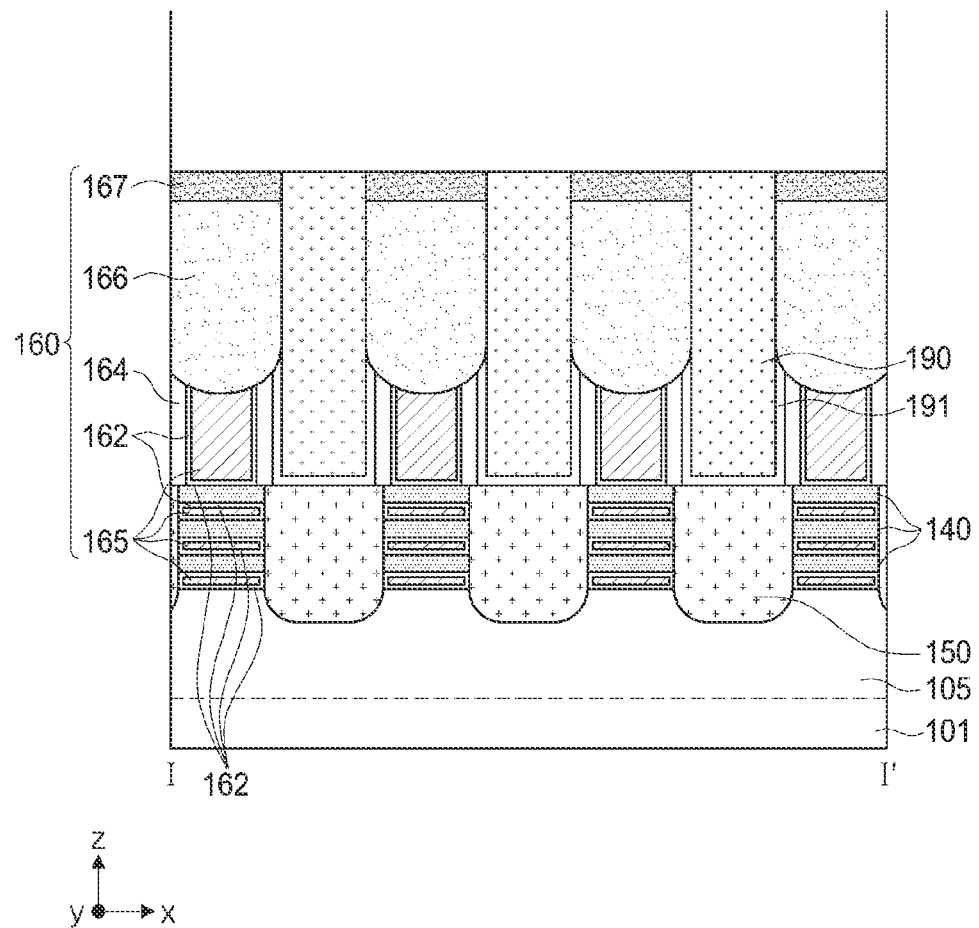
Figure 15B:
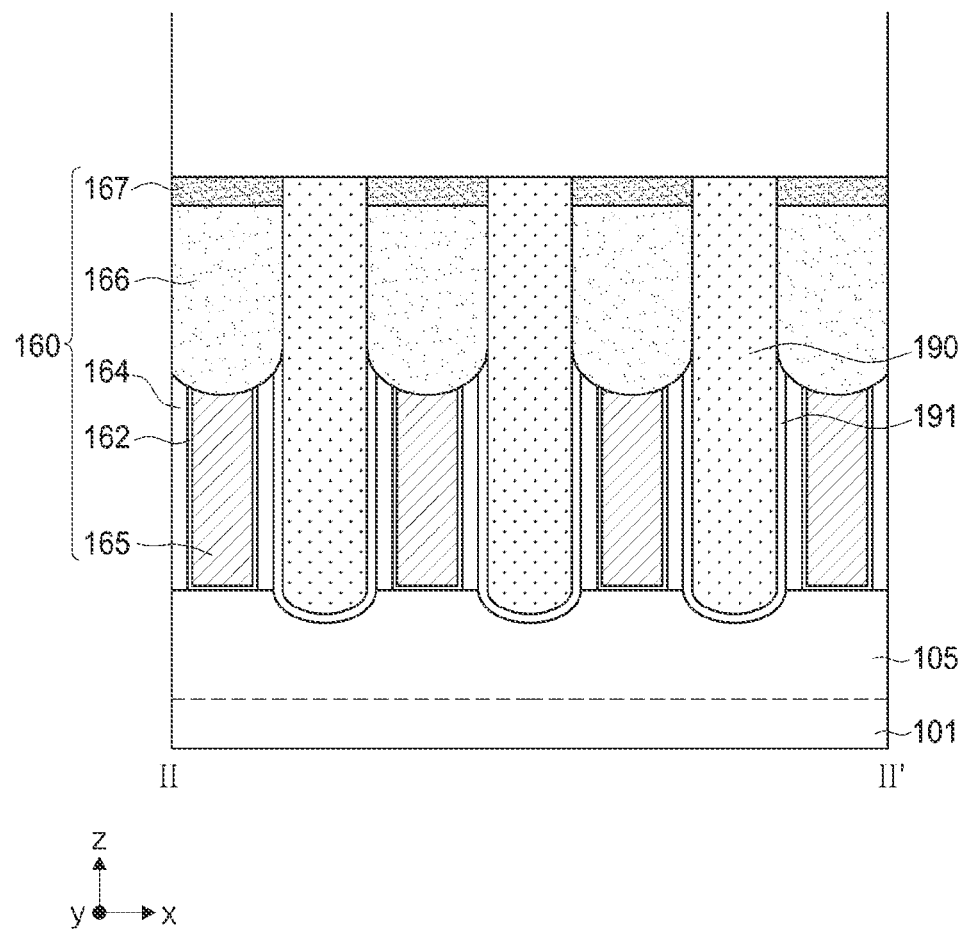
Figure 15C:
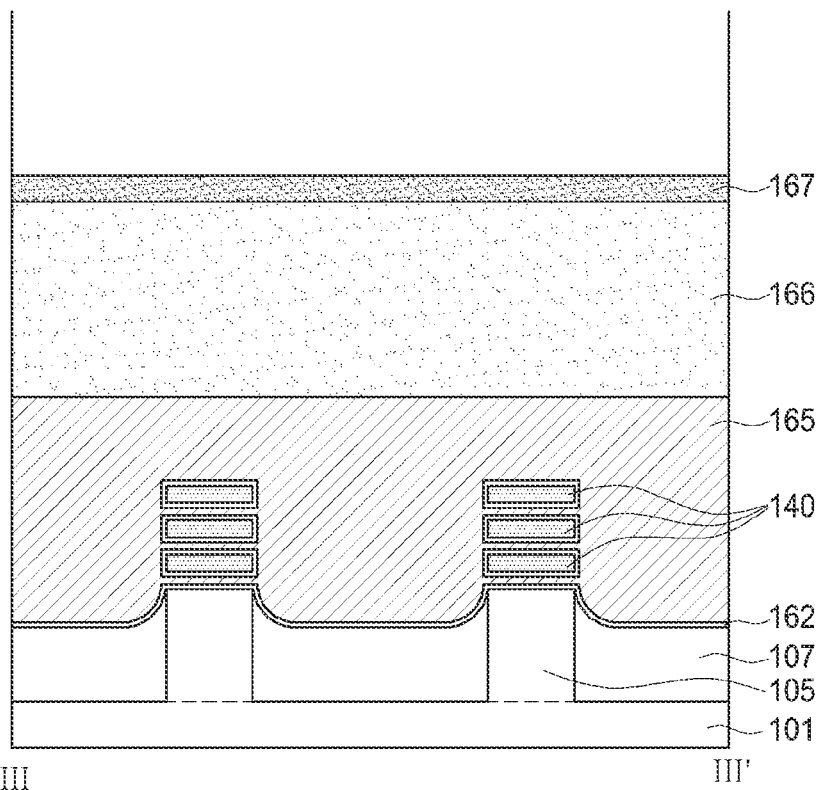

Referring to FIGS. 8, 10A, and 10B, portions of the sacrificial layers 111 and the channel layers 140 are etched using the sacrificial gate structures SG and the spacer structure 164 as an etch mask, to expose the active regions 105, and source/drain regions 150 may be formed to be disposed on the exposed active regions 105.

Between the sacrificial gate structures SG, the exposed sacrificial layers 111 and channel layers 140 may be removed to form a recess to expose the active regions 105. A portion of the substrate 101 may be recessed by forming the recess with a relatively deep depth, but the present inventive concept is not limited thereto, and the recess may be formed such that a lower surface of the recess contacts the substrate 101.

In this operation, a portion may be further removed from the side surfaces of the sacrificial layers 111 exposed by the recess. The sacrificial layers exposed by the recess may be selectively etched with respect to the channel layers 140 by, for example, a wet etching process, to be partially removed from the side surface in the X direction. Next, inner spacer layers may be formed in a region from which a portion of the side surfaces of the sacrificial layers 111 has been removed. The inner spacer layers may include at least one of SiN, SiCN, SiOCN, SiBCN, and SiBN. The inner spacer layers may be formed of the same material as the spacer structure 164, but the configuration is not limited thereto. However, in some embodiments, the operation of removing a portion of the sacrificial layers 111 and forming the inner spacer layers may be omitted.

Next, on at least one side of the sacrificial gate structures SG and the spacer structure 164, source/drain regions 150 may be formed on the active regions 105.

The source/drain regions 150 may be formed by performing an epitaxial growth process in the recess. The source/drain regions 150 may include impurities by, for example, in-situ doping.

Referring to FIGS. 8, 11A, 11B, 11C, and 11D, an insulating liner 191 and an interlayer insulating layer 190 may be sequentially formed, and a planarization process may be performed until the sacrificial gate layer SGL is exposed.

The insulating liner 191 may cover the sacrificial gate structures SG, the spacer structure 164, the source drain regions 150, and the device isolation layers 107. The interlayer insulating layer 190 may cover side and upper surfaces of the insulating liner 191. The interlayer insulating layer 190 may be formed of silicon oxide or a low dielectric material, and the insulating liner 191 may be formed of a material different from that of the interlayer insulating layer 190, for example, a silicon nitride or silicon nitride-based insulating material. A portion of the spacer structure 164, and the sacrificial gate capping layer SGC, may be removed through the planarization process.

Referring to FIGS. 12, 13A, 13B, and 13C, the sacrificial layers 111 and the sacrificial gate structures SG are removed, and the gate dielectric layer 162, the gate electrode 165, and the lower capping layer 166 may be formed.

The sacrificial layers 111 and the sacrificial gate structures SG may be selectively removed with respect to the spacer structure 164, the interlayer insulating layer 190, and the channel layers 140. First, upper gap regions may be formed by removing the sacrificial gate structures SG, and then, lower gap regions may be formed by removing the sacrificial layers 111 exposed through the upper gap regions. For example, when the sacrificial layers 111 include silicon germanium (SiGe) and the channel layers 140 include silicon (Si), the sacrificial layers 111 may be selectively removed by performing a wet etching process of using peracetic acid as an etchant.

Next, a gate dielectric layer 162 and a gate electrode 165 may be sequentially formed in the upper gap region and the lower gap region. The gate dielectric layer 162 may be formed to conformally cover inner surfaces of the upper gap regions and the lower gap regions. The gate electrode 165 may be formed by completely filling the upper gap regions and the lower gap regions.

Next, the upper portion of the gate electrode 165 and the upper portion of the spacer structure 164 are partially etched to a predetermined depth to lower the height of the upper surfaces, and the space formed as the upper surfaces is lowered may be filled with an insulating material, and a planarization process is performed, thereby forming the lower capping layer 166. The planarization process may be performed to expose the upper surface of the interlayer insulating layer 190, but in some embodiments, a portion of the upper surface of the interlayer insulating layer 190 may be recessed. The lower capping layer 166 may be formed of silicon nitride or a silicon nitride-based insulating material.

According to an example embodiment, in this operation, the lower capping layer 166 may be formed by recessing the sacrificial gate structures SG without operations of removing the sacrificial layers 111 and the sacrificial gate structures SG and forming the gate electrode 165 and the gate dielectric layer 162. After the upper capping layer 167 (refer to FIG. 15A) is formed through a subsequent process, the sacrificial layers 111 and the sacrificial gate structures SG are removed, and the gate electrode 165 and the gate dielectric layer 162 may be formed.

Referring to FIGS. 12, 14A, 14B, and 14C, a recess portion RP may be formed by partially removing the lower capping layer 166 from the upper portion by a predetermined depth. The recess portion RP may be formed by selectively etching a portion of the lower capping layer 166 with respect to the interlayer insulating layer 190. In an example embodiment, a side surface of the recess portion RP may be coplanar with a side surface of the lower capping layer 166. The recess portion RP may be a region in which the upper capping layer 167 of FIG. 2A is formed, through a subsequent process.

In this operation, in a case in which the lower surface of the recess portion RP is etched in a rounded shape while performing an etching process to form the recess portion RP having the same width as that of the lower capping layer 166, the semiconductor devices 100b of FIG. 5 may be formed.

In this operation, the semiconductor device 100c of FIG. 6 may be formed by forming the recess portion RP, using an etch mask exposing a region having a width greater than that of the lower capping layer 166. Accordingly, the width of a first contact plug (e.g., the contact plug 180 in FIG. 2B) may be adjusted.

Referring to FIGS. 12, 15A, 15B, and 15C, an upper capping layer 167 may be formed in the recess portion RP. The upper capping layer 167 may be formed by forming an insulating material covering the recess portion RP and the interlayer insulating layer 190 and performing a planarization process to expose the upper surface of the interlayer insulating layer 190. The upper capping layer 167 may include an insulating material different from that of the lower capping layer 166. The upper capping layer 167 may include a material having a relatively high etch selectivity with respect to the interlayer insulating layer 190 and having a dielectric constant similar to that of the lower capping layer 166. The upper capping layer 167 may include, for example, aluminum oxide (e.g. $Al_2O_3$). Accordingly, gate structures 160 including a gate dielectric layer 162, a gate electrode 165, a spacer structure 164, a lower capping layer 166, and an upper capping layer 167 may be formed.

Referring to FIGS. 16, 17A, 17B, 17C, and 17D, a hard mask HM exposing at least portions of the second upper capping layer 167b and the interlayer insulating layer 190 above the active regions 105 may be formed.

The gate structures 160 may include a first gate structure 160a and a second gate structure 160b that are spaced apart from each other and are parallel to each other. The hard mask HM may be disposed on the first gate structure 160a to cover the first gate structure 160a, and the hard mask HM may not be disposed on at least a portion of the second gate structure 160b. Accordingly, at least a portion of the upper surface of the second gate structure 160b may be exposed. The first gate structure 160a may include a first upper capping layer 167a, and the second gate structure 160b may include a second upper capping layer 167b.

The hard mask HM may have a line-shaped opening extending in one direction, for example, the X-direction formed by performing an exposure and etching process. Accordingly, referring to FIG. 17A, the hard mask HM is formed on the first upper capping layer 167a, and the hard mask HM may not be formed on portions of the second upper capping layer 167b and the interlayer insulating layer 190. However, in some embodiments, the hard mask HM may be formed on a portion of the first upper capping layer 167a due to an alignment problem in the exposure and etching processes, and thus, a portion of the first upper capping layer 167a may be exposed by the hard mask HM.

According to an example embodiment, unlike FIG. 16, the opening of the hard mask HM may be formed relatively wide to extend in a direction in which the spacer structure 164 extend, for example, in the Y-direction. Accordingly, the hard mask HM may form the opening on at least portions of the first active region 105a, the second active region 105b, and the device isolation layers 107. Accordingly, a common contact plug simultaneously connecting the first source/drain region 150a on the first active region 105a and the second source/drain region 150b on the second active region 105b may be formed by a subsequent process.

Figure 18:
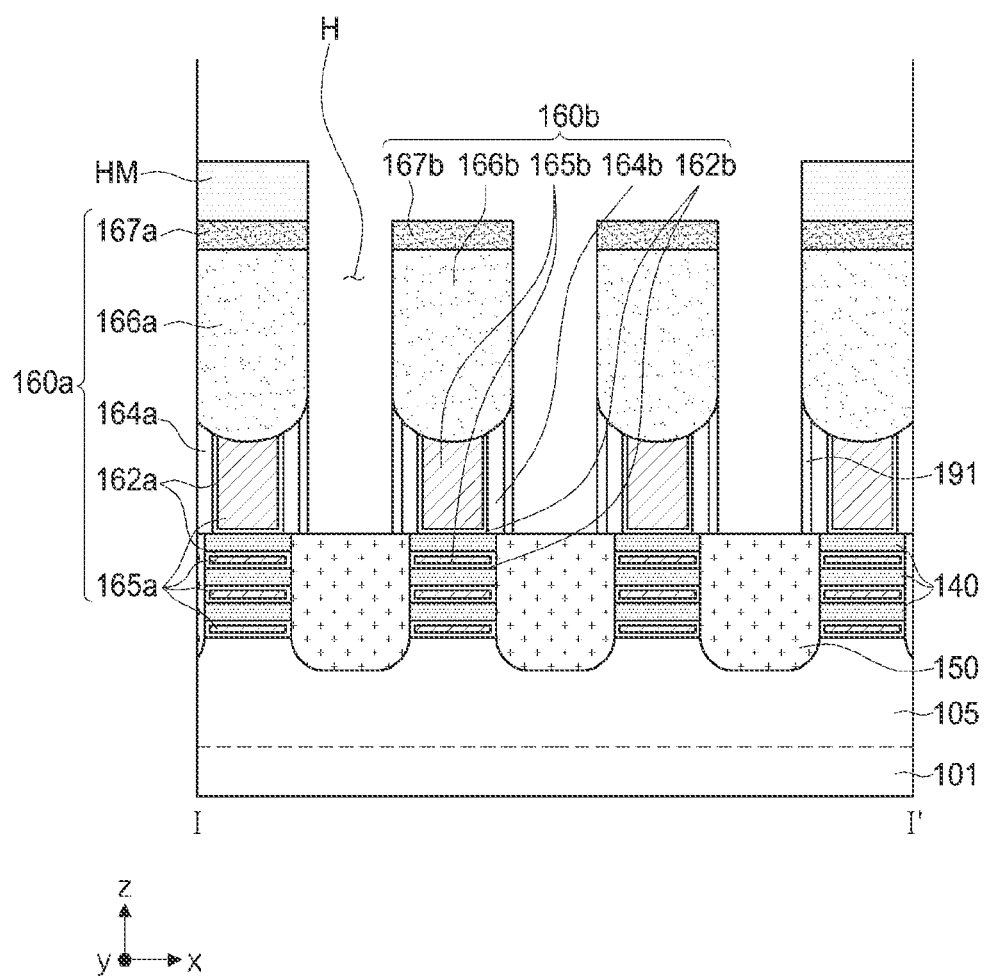

Referring to FIGS. 16 and 18, the interlayer insulating layer 190 is selectively etched on the active regions 105, and a contact hole H may be formed in the upper capping layer 167 and the lower capping layer 166.

The contact hole H may be formed by performing an etching process using the hard mask HM as an etching mask. An etching process may be performed on the upper surface of the interlayer insulating layer 190 and the upper surface of the second upper capping layer 167b exposed by the opening of the hard mask HM. The interlayer insulating layer 190 may have a high etch selectivity with respect to the second upper capping layer 167b during the etching process. The interlayer insulating layer 190 may have an etch selectivity in the range of about 15 to 20 to 1 in the etching process with respect to the second upper capping layer 167b, for example. The second upper capping layer 167b may have higher etch resistance than that of the second lower capping layer 166b. Accordingly, the second upper capping layer 167b may prevent the height of the upper surface of the second lower capping layer 166b from being lowered by the etching process, and only the interlayer insulating layer 190 may be selectively etched. As only the interlayer insulating layer 190 is selectively etched, the first upper capping layer 167a on which the hard mask BM is disposed, and the second upper capping layer 167b on which the hard mask HM is not disposed, to be exposed, may have substantially the same thickness. In some embodiments, an etching process for forming the contact hole H may not reduce a thickness of the second upper capping layer 167b in the Z direction, and the thickness of the second upper capping layer 167b in the Z direction may be equal to a thickness of the first upper capping layer 167a in the Z direction after the contact hole H is formed.

In the process of selectively etching only the interlayer insulating layer 190, the contact hole H may be formed by performing anisotropically etching the interlayer insulating layer 190 along the side surfaces of the upper capping layer 167 and the lower capping layer 166 in a direction perpendicular to the substrate 101. The upper capping layer 167 and the lower capping layer 166 may include a material having high etch resistance with respect to the interlayer insulating layer 190, to form the contact hole without etching the side surfaces thereof during the etching process. Accordingly, the upper capping layer 167 and the lower capping layer 166 may form the contact hole H for formation of a self aligning contact (SAC). The contact hole H may penetrate through the interlayer insulating layer 190 to contact the source/drain regions 150. In an example embodiment, the contact hole H may have an inclined side surface, as the contact hole H has a width decreasing in a direction toward the source/drain regions 150.

According to an example embodiment, unlike FIG. 16, a line-shaped contact trench may be formed by forming the opening of the hard mask HM to extend in one direction, for example, the Y-direction. Accordingly, the interlayer insulating layer 190 may be selectively etched with respect to the second upper capping layer 167b, and a line-shaped trench may be formed on at least one side of the upper capping layer 167 extending in the Y-direction.

In this operation, the second upper capping layer 167b may have a rounded corner by etching the corner, thereby forming the semiconductor device of FIG. 3. Although the corner of the second upper capping layer 167b is etched during the etching process, the upper surface is not etched, and thus, the second upper capping layer 167b may have substantially the same thickness as the first upper capping layer 167a. However, depending on an example embodiment, the upper surface of the second upper capping layer 167b may be etched, but a subsequent process such as a planarization process may be performed, and thus, the first upper capping layer 167a and the second upper capping layer 167b may have substantially the same thickness.

Figure 19:
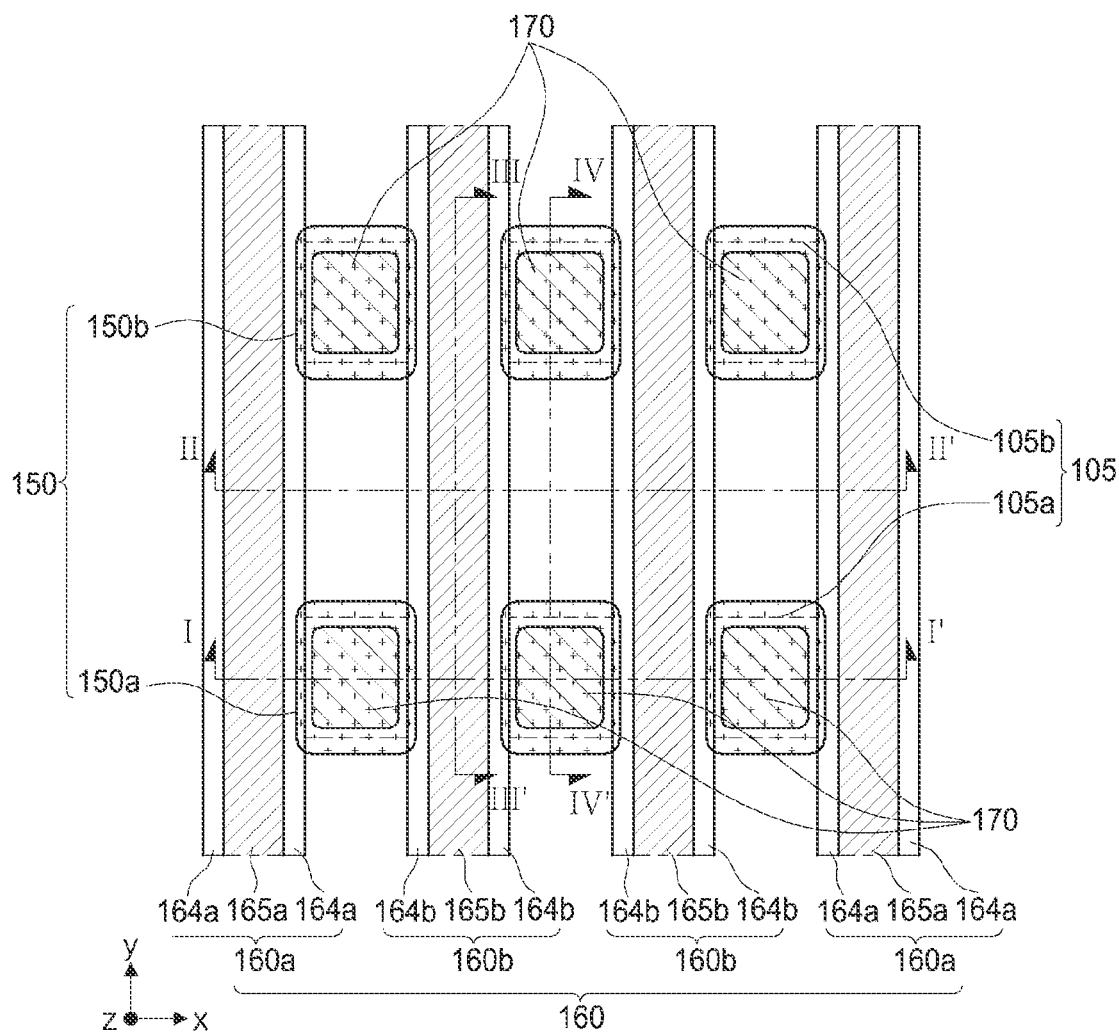

Referring to FIGS. 19 and 2A, a first contact plug 170 may be formed.

The hard mask HM may be removed, and the first barrier layer 172 may be conformally formed. The first barrier layer 172 may cover a side surface and a bottom surface of the contact hole H. Next, the contact hole H may be filled with a conductive material, and a planarization process may be performed to expose the upper surface of the upper capping layer 167, thereby forming the first plug layer 171. Accordingly, the first contact plug 170 serving as the self-aligned contact SAC may be formed.

Next, referring to FIGS. 1, 2B, and 2C together, a second contact plug 180 may be formed.

The second contact plug 180 may be formed by patterning the gate structures 160 to form a contact hole, and sequentially depositing a second barrier layer 182 and a second plug layer 181 in the contact hole. The contact hole may sequentially penetrate through the upper capping layer 167 and the lower capping layer 166 to contact the gate electrode 165. In some embodiments, the contact hole may extend while being recessed into the gate electrode 165, to contact the gate electrode 165.

The contact hole may include an upper contact hole penetrating into the upper capping layer 167 and a lower contact hole penetrating into the lower capping layer 166. The contact hole may be formed by performing a process including a two-step etching process for forming the upper contact hole and the lower contact hole. The upper contact hole may be formed by penetrating into the upper capping layer 167 through a wet etch process as the upper capping layer 167 includes a material having high etch resistance. Accordingly, the upper contact hole may have a convex side surface formed by isotropically etching the upper capping layer 167. The upper contact hole may have a convex side surface curved toward the upper capping layer 167. The lower contact hole may be formed by penetrating through the lower capping layer 166 through a dry etch process. Accordingly, unlike the upper contact hole, the lower contact hole may be anisotropically etched to have a straight side surface. The upper contact hole may have a side surface in a direction perpendicular to the substrate 101, but may have a side surface inclined relative to a direction perpendicular to the substrate 101 according to an example embodiment.

The second contact plug 180 may be formed by sequentially depositing a second barrier layer 182 and a second plug layer 181 in the contact hole and performing a planarization process. In some embodiments, the arrangement of the second contact plug 180 may be variously changed.

As set forth above, according to example embodiments, a lower capping layer on a gate electrode and an upper capping layer having relatively high etch resistance may be formed to protect the gate electrode during a self-aligning contact (SAC) forming process. In detail, a semiconductor device having an improved production yield may be provided by including the upper capping layer that protects the gate electrode exposed during the process of processing the line-type self-aligned contact (line SAC).

While example embodiments have been illustrated and described above, it will be apparent to those skilled in the art that modifications and variations could be made without departing from the scope of the present inventive concept as defined by the appended claims.

What is claimed is:

1. A semiconductor device comprising:
an active region extending on a substrate in a first direction;
a gate structure including a gate electrode extending on the substrate in a second direction and traversing the active region, a spacer structure extending on opposing sidewalls of the gate electrode in the second direction, and a capping layer on the gate electrode and the spacer structure;
a source/drain region on the active region adjacent the gate structure; and
a first contact plug connected to the source/drain region and a second contact plug connected to the gate structure,
wherein the capping layer includes a lower capping layer and an upper capping layer on the lower capping layer, and
the second contact plug penetrates through the capping layer, is connected to the gate electrode, and includes a convex sidewall curved toward the upper capping layer.

2. The semiconductor device of claim 1, wherein the gate structure is a first gate structure of a plurality of gate structures that further include a second gate structure extending parallel to the first gate structure, and
the upper capping layer of the first gate structure and an upper capping layer of the second gate structure have different shapes.

3. The semiconductor device of claim 2, wherein the upper capping layer of the first gate structure has an angled upper corner, and
the upper capping layer of the second gate structure has a rounded upper corner.

4. The semiconductor device of claim 1, wherein the first contact plug extends on at least one sidewall of the capping layer and extends in a third direction perpendicular to an upper surface of the substrate.

5. The semiconductor device of claim 1, wherein a lower surface of the lower capping layer has a convex shape curved toward the substrate,
the lower surface of the lower capping layer extends on the gate electrode and the spacer structure, and a portion of an upper surface of the spacer structure and a portion of an upper surface of the gate electrode are conformal with the lower surface of the lower capping layer.

6. The semiconductor device of claim 1, wherein the upper capping layer is spaced apart from the spacer structure and is in contact with an upper surface of the lower capping layer.

7. The semiconductor device of claim 1, wherein the lower capping layer and the upper capping layer include different materials, and
the upper capping layer includes aluminum oxide.

8. The semiconductor device of claim 1, wherein the convex sidewall of the second contact plug is recessed relative to a sidewall of the lower capping layer.

9. The semiconductor device of claim 1, wherein the first contact plug comprises a sidewall that is curved relative to an upper surface of the substrate,
the gate structure is a first gate structure of a plurality of gate structures that further comprises a second gate structure directly adjacent the first gate structure, and
a width of the first contact plug in the first direction is equal to a distance between upper capping layers of the first and second gate structures.

10. The semiconductor device of claim 1, wherein a first thickness of the upper capping layer is less than a second thickness of the lower capping layer.

11. The semiconductor device of claim 1, wherein a first width of the upper capping layer in the first direction is substantially equal to a second width of the lower capping layer in the first direction.

12. The semiconductor device of claim 1, wherein a first width of the upper capping layer in the first direction is greater than a second width of the lower capping layer in the first direction.

13. The semiconductor device of claim 12, further comprising an interlayer insulating layer on the source/drain region,
wherein a sidewall of the lower capping layer is spaced apart from the first contact plug and is in contact with the interlayer insulating layer.

14. A semiconductor device comprising:
an active region extending on a substrate in a first direction;
a plurality of channel layers spaced apart from each other vertically on the active region;
a gate structure including a gate electrode extending in a second direction and traversing the active region and the plurality of channel layers, a spacer structure extending on opposing sidewalls of the gate electrode in the second direction, and a capping layer on the gate electrode and the spacer structure;
a source/drain region on the active region adjacent the gate structure and in contact with the plurality of channel layers; and
a contact plug including a first contact plug connected to the source/drain region and a second contact plug connected to the gate structure,
wherein the capping layer includes a lower capping layer and an upper capping layer on the lower capping layer, and
the second contact plug penetrates through the capping layer, is connected to the gate electrode, and includes a convex sidewall curved toward the upper capping layer.

15. The semiconductor device of claim 14, wherein the gate structure is a first gate structure of a plurality of gate structures that further include a second gate structure extending parallel to the first gate structure,
the upper capping layer of the first gate structure comprises an angled upper corner, and
an upper capping layer of the second gate structure comprises a rounded upper corner.

16. The semiconductor device of claim 15, wherein at least a portion of a sidewall of the first contact plug contacts the upper capping layer and the lower capping layer of the first gate structure.

17. A semiconductor device comprising:
an active region extending on a substrate in a first direction;
first and second gate structures each including a gate electrode extending on the substrate in a second direction and traversing the active region, a spacer structure extending on opposing sidewalls of the gate electrode in the second direction, and a capping layer on the gate electrode and the spacer structure;
a source/drain region on the active region adjacent the first gate structure; and
a contact plug connected to the source/drain region,
wherein the capping layer includes a lower capping layer and an upper capping layer on the lower capping layer, and
the upper capping layer of the first gate structure and the upper capping layer of the second gate structure have different shapes, and wherein a side surface of the upper capping layer of the second gate structure has a concave shape.

18. The semiconductor device of claim 17, wherein an upper surface of the upper capping layer of the first gate structure is on substantially the same level as an upper surface of the upper capping layer of the second gate structure from an upper surface of the substrate.

19. The semiconductor device of claim 17, wherein the first gate structure is directly adjacent the second gate structure, and
the contact plug extends between the upper capping layers of the first and second gate structures and between the lower capping layers of the first and second gate structures,
wherein the side surface of the upper capping layer of the second gate structure is recessed relative to a side surface of the lower capping layer of the second gate structure.

20. The semiconductor device of claim 17, wherein the lower capping layer includes silicon nitride, and the upper capping layer includes aluminum oxide.

* * * * *